United States Patent
Shumaker et al.

(10) Patent No.: US 11,923,859 B2
(45) Date of Patent: Mar. 5, 2024

(54) HIGH-RESOLUTION AND AGILE FREQUENCY MEASUREMENT

(71) Applicant: Intel Corporation, Santa Clara, CA (US)

(72) Inventors: Evgeny Shumaker, Nesher (IL); Sergey Bershansky, Netanya (IL); Ofir Degani, Haifa (IL); Run Levinger, Tel Aviv (IL)

(73) Assignee: Intel Corporation, Santa Clara, CA (US)

( * ) Notice: Subject to any disclaimer, the term of this patent is extended or adjusted under 35 U.S.C. 154(b) by 647 days.

(21) Appl. No.: 17/033,122

(22) Filed: Sep. 25, 2020

(65) Prior Publication Data
US 2022/0103180 A1    Mar. 31, 2022

(51) Int. Cl.
| H03L 7/085 | (2006.01) |
| G04F 10/00 | (2006.01) |
| H03M 1/50 | (2006.01) |

(52) U.S. Cl.
CPC .......... H03L 7/085 (2013.01); G04F 10/005 (2013.01); H03M 1/50 (2013.01)

(58) Field of Classification Search
CPC ......... H03L 7/085; G04F 10/005; H03M 1/50
See application file for complete search history.

(56) References Cited

U.S. PATENT DOCUMENTS

| 8,248,106 B1 | 8/2012 | Cohen et al. |
| 8,816,735 B1 * | 8/2014 | Chen ...................... H03L 7/085 327/158 |

(Continued)

FOREIGN PATENT DOCUMENTS

| CN | 116093953 A * | 5/2023 | |
| EP | 3975430 A1 * | 3/2022 | ........... G04F 10/005 |

(Continued)

OTHER PUBLICATIONS

"European Application Serial No. 21193062.3, Response filed Sep. 28, 2022 to Extended European Search Report dated Feb. 11, 2022", 88 pgs.

(Continued)

*Primary Examiner* — Adam D Houston
(74) *Attorney, Agent, or Firm* — Schwegman Lundberg & Woessner, P.A.

(57) ABSTRACT

An apparatus for generating a frequency estimate of an output signal includes a reference signal generator configured to generate a reference clock signal. The apparatus includes frequency estimation circuitry configured to generate a cycle count based frequency estimation of the output signal based on the reference clock signal and a clock cycle count of the output signal. The frequency estimation circuitry further generates a fractional frequency estimation of the output signal based on the reference clock signal and a plurality of time-to-digital conversion phase samples of the output signal. The frequency estimation circuitry further generates the frequency estimate of the output signal using the cycle count based frequency estimation within a range and a frequency error determined from the fractional frequency estimation. The plurality of time-to-digital conversion phase samples and the cycle count based frequency estimation use a same number of reference clock cycles of the reference clock signal.

20 Claims, 12 Drawing Sheets

(56) References Cited

U.S. PATENT DOCUMENTS

| | | | | |
|---|---|---|---|---|
| 9,473,155 | B2* | 10/2016 | Staszewski | H03L 7/1976 |
| 10,623,008 | B2* | 4/2020 | Upadhyaya | H03L 7/18 |
| 11,469,877 | B1* | 10/2022 | Raj | H04L 25/4917 |
| 2008/0068236 | A1* | 3/2008 | Sheba | G04F 10/005 |
| | | | | 341/131 |
| 2010/0066421 | A1 | 3/2010 | Geng et al. | |
| 2010/0134160 | A1 | 6/2010 | Min et al. | |
| 2016/0106381 | A1* | 4/2016 | Aase | A61B 8/429 |
| | | | | 600/459 |
| 2018/0095119 | A1 | 4/2018 | Chillara et al. | |

FOREIGN PATENT DOCUMENTS

| | | | | |
|---|---|---|---|---|
| WO | WO-2021257601 | A1 * | 12/2021 | A61B 5/302 |
| WO | WO-2022266252 | A1 * | 12/2022 | |

OTHER PUBLICATIONS

"European Application Serial No. 21193062.3, Extended European Search Report dated Feb. 11, 2022", 5 pgs.

* cited by examiner

HIGH-RESOLUTION AND AGILE FREQUENCY MEASUREMENT

TECHNICAL FIELD

Various embodiments generally may relate to the field of frequency generation and frequency measurement. Some embodiments relate to high-resolution and agile frequency measurement techniques.

BACKGROUND

Precise and agile digital frequency measurement is often demanded in various electronic systems, particularly in the domain of frequency generation. Example tasks, the successful performance of which depends on both the agility and precision of frequency measurement, include oscillator frequency control characterization based on fine-resolution control knobs, environmental (temperature, stress) dynamics tracking, built-in self-test (BIST) applications, and/or high volume manufacturing (HVM) characterization.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which.

DETAILED DESCRIPTION

Figure 1:
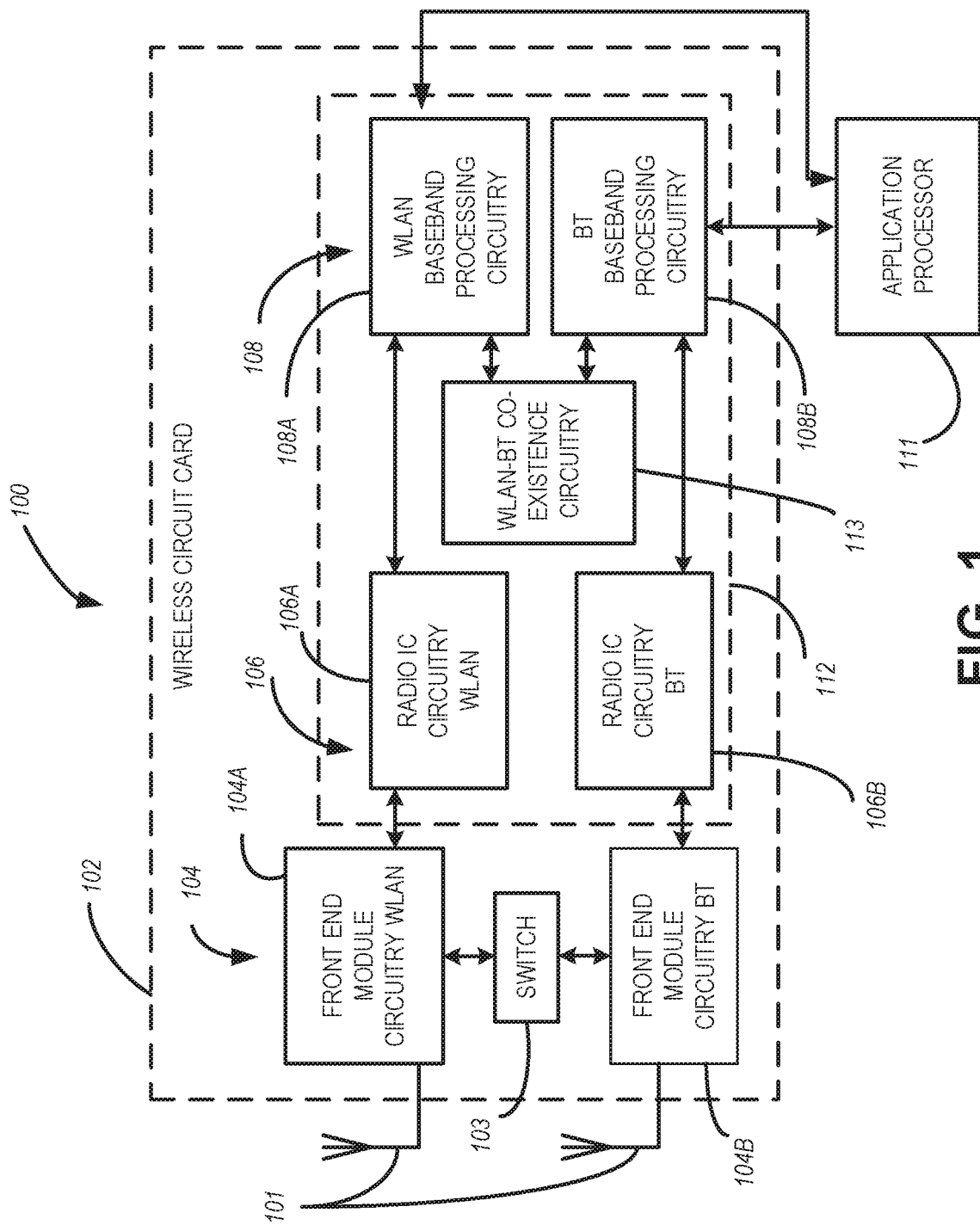
FIG. 1 is a block diagram of a radio architecture, in accordance with some embodiments.

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

The following description and the drawings sufficiently illustrate specific embodiments to enable those skilled in the art to practice them. Other embodiments may incorporate structural, logical, electrical, process, and other changes. Portions and features of some embodiments may be included in or substituted for, those of other embodiments. Embodiments outlined in the claims encompass all available equivalents of those claims.

The standard solution for unambiguous digital frequency estimation is based on a digital cycle counter that is set to operate in a pre-defined time window (period). Counting the full cycles of the measured source signal provides the digital estimate. However, the main disadvantage of the standard solution is the slow measurement-time-to-resolution tradeoff. More specifically, the time required to be spent on the measurement aimed at achieving sufficient resolution if often forbiddingly high. Additionally, during the measurement time, the signal might have already changed its frequency due to environment-induced drift, thereby making the measurement inaccurate.

Techniques discussed herein may be used to augment the frequency measurement taken by a regular cycle counter (CC) with an optimal fractional frequency estimate based on phase samples taken by a small dynamic range time-to-digital converter (TDC) (such as usually employed for a divider-less phased-locked-loop, estimating the relative phase of the LO either directly or after a small and constant division ratio pre-scaler). TDCs, that are used to digitize the time difference between the edges of reference and local oscillator clock in phase-locked loops, are a prospective candidate to enhance the time-to-resolution trade-off rate using the disclosed techniques, assuming that the ambiguity of measurement introduced by aliasing is solved. The fine resolution of the TDC allows to significantly enhance the precision of the overall measurement, using a limited number of phase samples, hence providing a significant measurement speed increase. The coinciding (in time) analog counter measurement allows for resolving of the aliasing induced ambiguity of the divider-less TDC.

Agile and precise frequency estimation using the disclosed techniques may be used in connection with thorough calibration processes allowing for more precise operation ultimately resulting in better key performance indicators (KPIs). The dynamics of environmental changes may also be tracked (and mitigated) using the proposed techniques. The disclosed techniques may also be used to enable foreground calibration flows which would otherwise take forbiddingly long periods.

The two main traits of frequency estimation, the speed and precision, are inevitably in odds with each other due to fundamental but also practical reasons. A good example of the first variety would be noise-related limitations—in independent, identically distributed (IID) measurements (e.g., uncorrelated noise), the standard deviation would scale with $K^{(-1/2)}$ (where K is the number of measurements taken) and, therefore, precision would improve over time spent (the same conclusion would result also in practical non-white-noise cases, although with a slower diminishing uncertainty). However, most of the time, practical reasons would limit the precision of measurements significantly above that noise-related bound. In particular, resolution (e.g., quantization) limits the measurement uncertainty at significantly higher levels. Digital frequency characterization techniques implemented using cycle counters trade time for certainty at better rates than in case of noise, but such techniques are still not associated with a significant improvement in processing speed (e.g., improving the resolution two-fold requires a two-fold increase in the measurement time as resolution scales with $K^{(-1)}$, which is faster than noise but not optimal).

FIG. 1 is a block diagram of a radio architecture 100 in accordance with some embodiments. The radio architecture 100 may be implemented in a computing device including user equipment (UE), a base station (e.g., a next generation Node-B (gNB), enhanced Node-B (eNB)), a smartphone, or another type of wired or wireless device using synthesizer circuitry with frequency estimation. The radio architecture 100 may include radio front-end module (FEM) circuitry 104, radio IC circuitry 106, and baseband processing circuitry 108. Radio architecture 100 as shown includes both Wireless Local Area Network (WLAN) functionality and Bluetooth (BT) functionality although embodiments are not so limited. In this disclosure, "WLAN" and "Wi-Fi" are used interchangeably.

FEM circuitry 104 may include a WLAN or Wi-Fi FEM circuitry 104A and a Bluetooth (BT) FEM circuitry 104B. The WLAN FEM circuitry 104A may include a receive signal path comprising circuitry configured to operate on WLAN RF signals received from one or more antennas 101, to amplify the received signals and to provide the amplified versions of the received signals to the WLAN radio IC circuitry 106A for further processing. The BT FEM circuitry 104B may include a receive signal path which may include circuitry configured to operate on BT RF signals received from the one or more antennas 101, to amplify the received signals and to provide the amplified versions of the received signals to the BT radio IC circuitry 106B for further processing. The FEM circuitry 104A may also include a transmit signal path which may include circuitry configured to amplify WLAN signals provided by the radio IC circuitry 106A for wireless transmission by the one or more antennas 101. Besides, the FEM circuitry 104B may also include a transmit signal path which may include circuitry configured to amplify BT signals provided by the radio IC circuitry 106B for wireless transmission by the one or more antennas. In the embodiment of FIG. 1, although FEM 104A and FEM 104B are shown as being distinct from one another, embodiments are not so limited and include within their scope the use of a FEM (not shown) that includes a transmit path and/or a receive path for both WLAN and BT signals, or the use of one or more FEM circuitries where at least some of the FEM circuitries share transmit and/or receive signal paths for both WLAN and BT signals.

Radio IC circuitry 106 as shown may include WLAN radio IC circuitry 106A and BT radio IC circuitry 106B. The WLAN radio IC circuitry 106A may include a receive signal path which may include circuitry to down-convert WLAN RF signals received from the FEM circuitry 104A and provide baseband signals to WLAN baseband processing circuitry 108A. The BT radio IC circuitry 106B may, in turn, include a receive signal path which may include circuitry to down-convert BT RF signals received from the FEM circuitry 104B and provide baseband signals to BT baseband processing circuitry 108B. The WLAN radio IC circuitry 106A may also include a transmit signal path which may include circuitry to up-convert WLAN baseband signals provided by the WLAN baseband processing circuitry 108A and provide WLAN RF output signals to the FEM circuitry 104A for subsequent wireless transmission by the one or more antennas 101. The BT radio IC circuitry 106B may also include a transmit signal path which may include circuitry to up-convert BT baseband signals provided by the BT baseband processing circuitry 108B and provide BT RF output signals to the FEM circuitry 104B for subsequent wireless transmission by the one or more antennas 101. In the embodiment of FIG. 1, although radio IC circuitries 106A and 106B are shown as being distinct from one another, embodiments are not so limited and include within their scope the use of a radio IC circuitry (not shown) that includes a transmit signal path and/or a receive signal path for both WLAN and BT signals, or the use of one or more radio IC circuitries where at least some of the radio IC circuitries share transmit and/or receive signal paths for both WLAN and BT signals.

In some aspects, the radio IC circuitry 106 (e.g., the WLAN radio IC circuitry 106A and the BT radio IC circuitry 106B) uses synthesizer circuitry (e.g., synthesizer circuitry illustrated in FIG. 3 or a digital frequency synthesizer illustrated in FIG. 5) using one or more of the disclosed techniques for frequency estimation.

Baseband processing circuitry 108 may include a WLAN baseband processing circuitry 108A and a BT baseband processing circuitry 108B. The WLAN baseband processing circuitry 108A may include a memory, such as, for example, a set of RAM arrays in a Fast Fourier Transform (FFT) or Inverse Fast Fourier Transform (IFFT) block (not shown) of the WLAN baseband processing circuitry 108A. Each of the WLAN baseband processing circuitry 108A and the BT baseband processing circuitry 108B may further include one or more processors and control logic to process the signals received from the corresponding WLAN or BT receive signal path of the radio IC circuitry 106, and to also generate corresponding WLAN or BT baseband signals for the transmit signal path of the radio IC circuitry 106. Each of the baseband processing circuitries 108A and 108B may further include physical layer (PHY) and medium access control layer (MAC) circuitry and may further interface with the application processor 111 for generation and processing of the baseband signals and for controlling operations of the radio IC circuitry 106.

Referring still to FIG. 1, according to the shown embodiment, WLAN-BT coexistence circuitry 113 may include logic providing an interface between the WLAN baseband processing circuitry 108A and the BT baseband processing circuitry 108B to enable use cases requiring WLAN and BT coexistence. In addition, a switch 103 may be provided between the WLAN FEM circuitry 104A and the BT FEM circuitry 104B to allow switching between the WLAN and BT radios according to application needs. In addition, although the one or more antennas 101 are depicted as being respectively connected to the WLAN FEM circuitry 104A and the BT FEM circuitry 104B, embodiments include within their scope the sharing of one or more antennas as between the WLAN and BT FEMs, or the provision of more than one antenna connected to each of FEM 104A or 104B.

In some embodiments, the front-end module circuitry 104, the radio IC circuitry 106, and the baseband processing circuitry 108 may be provided on a single radio card, such as wireless radio card 102. In some other embodiments, the one or more antennas 101, the FEM circuitry 104, and the radio IC circuitry 106 may be provided on a single radio card. In some other embodiments, the radio IC circuitry 106 and the baseband processing circuitry 108 may be provided on a single chip or integrated circuit (IC), such as IC 112.

In some embodiments, the wireless radio card 102 may include a WLAN radio card and may be configured for Wi-Fi communications, although the scope of the embodiments is not limited in this respect. In some of these embodiments, the radio architecture 100 may be configured to receive and transmit orthogonal frequency division multiplexed (OFDM) or orthogonal frequency division multiple access (OFDMA) communication signals over a multicarrier communication channel. The OFDM or OFDMA signals may comprise a plurality of orthogonal subcarriers. In some embodiments, the wireless radio card 102 may include a platform controller hub (PCH) system-on-a-chip (SOC) and a central processing unit (CPU)/host SOC.

In some of these multicarrier embodiments, radio architecture 100 may be part of a Wi-Fi communication station (STA) such as a wireless access point (AP), a base station, or a mobile device including a Wi-Fi enabled device. In some of these embodiments, radio architecture 100 may be configured to transmit and receive signals in accordance with specific communication standards and/or protocols, such as any of the Institute of Electrical and Electronics Engineers (IEEE) standards including, 802.11n-2009, IEEE 802.11-2012, 802.11n-2009, 802.11ac, IEEE 802.11-2016, and/or 802.11ax standards and/or proposed specifications for WLANs, although the scope of embodiments is not limited in this respect. Radio architecture 100 may also be suitable to transmit and/or receive communications in accordance with other techniques and standards, including a $3^{rd}$ Generation Partnership Project (3GPP) standard, including a communication standard used in connection with 5G or new radio (NR) communications.

In some embodiments, the radio architecture 100 may be configured for high-efficiency (HE) Wi-Fi communications in accordance with the IEEE 802.11ax standard or another standard associated with wireless communications. In these embodiments, the radio architecture 100 may be configured to communicate in accordance with an OFDMA technique, although the scope of the embodiments is not limited in this respect.

In some other embodiments, the radio architecture 100 may be configured to transmit and receive signals transmitted using one or more other modulation techniques such as spread spectrum modulation (e.g., direct sequence code division multiple access (DS-CDMA) and/or frequency hopping code division multiple access (FH-CDMA)), time-division multiplexing (TDM) modulation, and/or frequency-division multiplexing (FDM) modulation, although the scope of the embodiments is not limited in this respect.

In some embodiments, as further shown in FIG. 1, the BT baseband processing circuitry 108B may be compliant with a Bluetooth (BT) connectivity standard such as Bluetooth, Bluetooth 4.0 or Bluetooth 5.0, or any other iteration of the Bluetooth Standard. In embodiments that include BT functionality as shown for example in FIG. 1, the radio architecture 100 may be configured to establish a BT synchronous connection-oriented (SCO) link and or a BT low energy (BT LE) link. In some of the embodiments that include functionality, the radio architecture 100 may be configured to establish an extended SCO (eSCO) link for BT communications, although the scope of the embodiments is not limited in this respect. In some of these embodiments that include a BT functionality, the radio architecture may be configured to engage in a BT Asynchronous Connection-Less (ACL) communications, although the scope of the embodiments is not limited in this respect. In some embodiments, as shown in FIG. 1, the functions of a BT radio card and WLAN radio card may be combined on a single wireless radio card, such as the single wireless radio card 102, although embodiments are not so limited, and include within their scope discrete WLAN and BT radio cards In some embodiments, the radio architecture 100 may include other radio cards, such as a cellular radio card configured for cellular (e.g., 3GPP such as LTE, LTE-Advanced, or 5G communications).

In some IEEE 802.11 embodiments, the radio architecture 100 may be configured for communication over various channel bandwidths including bandwidths having center frequencies of about 900 MHz, 2.4 GHz, 5 GHz, and bandwidths of about 1 MHz, 2 MHz, 2.5 MHz, 4 MHz, 5 MHz, 8 MHz, 10 MHz, 16 MHz, 20 MHz, 40 MHz, 80 MHz (with contiguous bandwidths) or 80+80 MHz (160 MHz) (with non-contiguous bandwidths). In some embodiments, a 320 MHz channel bandwidth may be used. The scope of the embodiments is not limited with respect to the above center frequencies, however.

Figure 2:
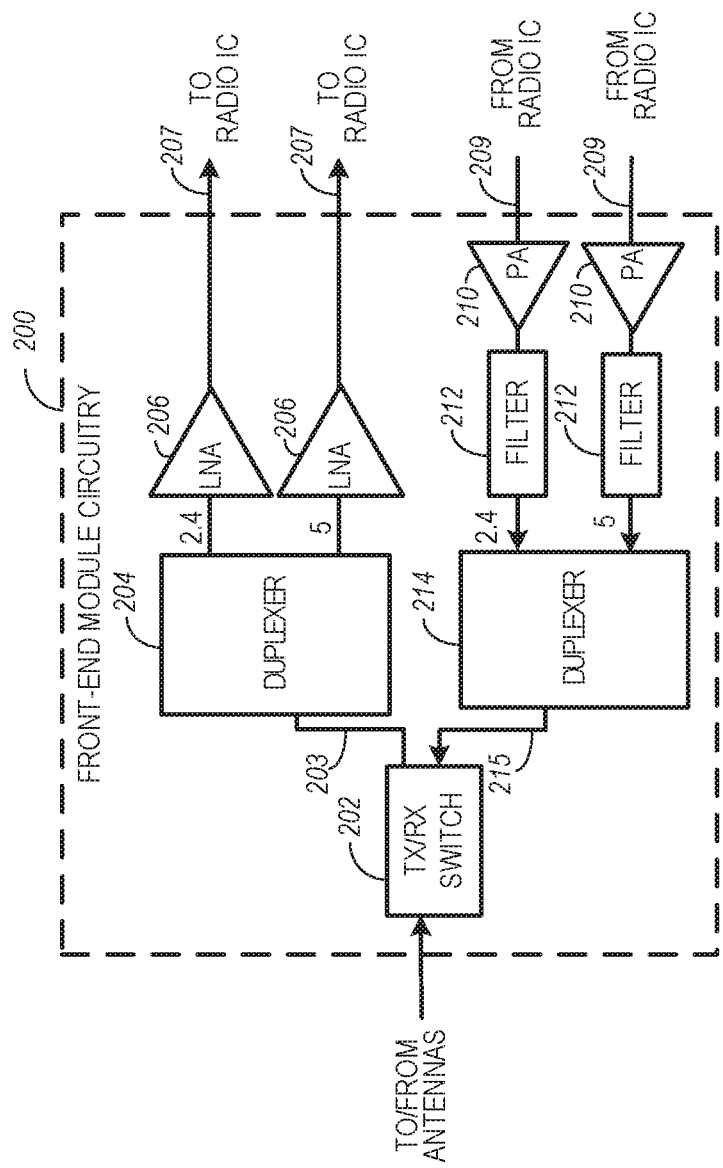
FIG. 2 illustrates a front-end module circuitry for use in the radio architecture of FIG. 1, in accordance with some embodiments.

FIG. 2 illustrates FEM circuitry 200 in accordance with some embodiments. The FEM circuitry 200 is one example of circuitry that may be suitable for use as the WLAN and/or BT FEM circuitry 104A/104B (FIG. 1), although other circuitry configurations may also be suitable.

In some embodiments, the FEM circuitry 200 may include a TX/RX switch 202 to switch between transmit (TX) mode and receive (RX) mode operation. The FEM circuitry 200 may include a receive signal path and a transmit signal path. The receive signal path of the FEM circuitry 200 may include a low-noise amplifier (LNA) 206 to amplify received RF signals 203 and provide the amplified received RF signals 207 as an output (e.g., to the radio IC circuitry 106 (FIG. 1)). The transmit signal path of the FEM circuitry 200 may include a power amplifier (PA) to amplify input RF signals 209 (e.g., provided by the radio IC circuitry 106), and one or more filters 212, such as band-pass filters (BPFs), low-pass filters (LPFs) or other types of filters, to generate RF signals 215 for subsequent transmission (e.g., by the one or more antennas 101 (FIG. 1)).

In some dual-mode embodiments for Wi-Fi communication, the FEM circuitry 200 may be configured to operate in either the 2.4 GHz frequency spectrum or the 5 GHz frequency spectrum. In these embodiments, the receive signal path of the FEM circuitry 200 may include a receive signal path duplexer 204 to separate the signals from each spectrum as well as provide a separate LNA 206 for each spectrum as shown. In these embodiments, the transmit signal path of the FEM circuitry 200 may also include a power amplifier 210 and one or more filters 212, such as a BPF, an LPF, or another type of filter for each frequency spectrum, and a transmit signal path duplexer 214 to provide the signals of one of the different spectrums onto a single transmit path for subsequent transmission by the one or more antennas 101 (FIG. 1). In some embodiments, BT communications may utilize the 2.4 GHz signal paths and may utilize the same FEM circuitry 200 as the one used for WLAN communications.

Figure 3:
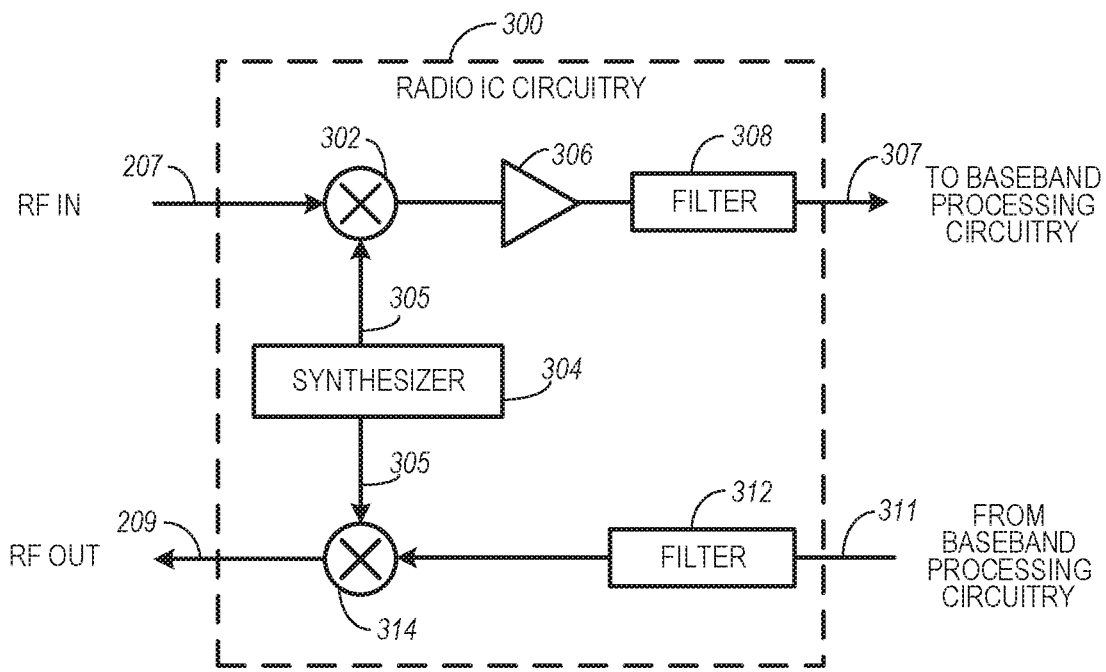
FIG. 3 illustrates a radio IC circuitry for use in the radio architecture of FIG. 1, in accordance with some embodiments.

FIG. 3 illustrates radio IC circuitry 300 in accordance with some embodiments. The radio IC circuitry 300 is one example of circuitry that may be suitable for use as the WLAN or BT radio IC circuitry 106A/106B (FIG. 1), although other circuitry configurations may also be suitable.

In some embodiments, the radio IC circuitry 300 may include a receive signal path and a transmit signal path. The receive signal path of the radio IC circuitry 300 may include mixer circuitry 302, such as, for example, down-conversion mixer circuitry, amplifier circuitry 306, and filter circuitry 308. The transmit signal path of the radio IC circuitry 300 may include at least filter circuitry 312 and mixer circuitry 314, such as up-conversion mixer circuitry. Radio IC circuitry 300 may also include synthesizer circuitry 304 for synthesizing a frequency 305 for use by the mixer circuitry 302 and the mixer circuitry 314. The mixer circuitry 302 and/or 314 may each, according to some embodiments, be configured to provide direct conversion functionality. The latter type of circuitry presents a much simpler architecture as compared with standard super-heterodyne mixer circuitries, and any flicker noise brought about by the same may be alleviated for example through the use of OFDM modulation. FIG. 3 illustrates only a simplified version of a radio IC circuitry and may include, although not shown, embodiments where each of the depicted circuitries may include more than one component. For instance, mixer circuitry 320 and/or 314 may each include one or more mixers, and filter circuitries 308 and/or 312 may each include one or more filters, such as one or more BPFs and/or LPFs according to application needs. For example, when mixer circuitries are of the direct-conversion type, they may each include two or more mixers.

In some embodiments, mixer circuitry 302 may be configured to down-convert RF signals 207 received from the FEM circuitry 104 (FIG. 1) based on the synthesized frequency 305 provided by the synthesizer circuitry 304. The amplifier circuitry 306 may be configured to amplify the down-converted signals and the filter circuitry 308 may include an LPF configured to remove unwanted signals from the down-converted signals to generate output baseband signals 307. Output baseband signals 307 may be provided to the baseband processing circuitry 108 (FIG. 1) for further processing. In some embodiments, the output baseband signals 307 may be zero-frequency baseband signals, although this is not a requirement. In some embodiments, mixer circuitry 302 may comprise passive mixers, although the scope of the embodiments is not limited in this respect.

In some embodiments, the mixer circuitry 314 may be configured to up-convert input baseband signals 311 based on the synthesized frequency 305 provided by the synthesizer circuitry 304 to generate RF output signals 209 for the FEM circuitry 104. The baseband signals 311 may be provided by the baseband processing circuitry 108 and may be filtered by filter circuitry 312. The filter circuitry 312 may include an LPF or a BPF, although the scope of the embodiments is not limited in this respect.

In some embodiments, the mixer circuitry 302 and the mixer circuitry 314 may each include two or more mixers and may be arranged for quadrature down-conversion and/or up-conversion respectively with the help of the synthesizer circuitry 304. In some embodiments, the mixer circuitry 302 and the mixer circuitry 314 may each include two or more mixers each configured for image rejection (e.g., Hartley image rejection). In some embodiments, the mixer circuitry 302 and the mixer circuitry 314 may be arranged for direct down-conversion and/or direct up-conversion, respectively. In some embodiments, the mixer circuitry 302 and the mixer circuitry 314 may be configured for super-heterodyne operation, although this is not a requirement.

Mixer circuitry 302 may comprise, according to one embodiment: quadrature passive mixers (e.g., for the in-phase (I) and quadrature-phase (Q) paths). In such an embodiment, RF input signal 207 from FIG. 2 may be down-converted to provide I and Q baseband output signals to be sent to the baseband processor.

Quadrature passive mixers may be driven by zero and ninety-degree time-varying LO switching signals provided by a quadrature circuitry which may be configured to receive a LO frequency (fLO) from a local oscillator or a synthesizer, such as LO frequency 305 of synthesizer circuitry 304 (FIG. 3). In some embodiments, the LO frequency may be the carrier frequency, while in other embodiments, the LO frequency may be a fraction of the carrier frequency (e.g., one-half the carrier frequency, one-third the carrier frequency). In some embodiments, the zero and ninety-degree time-varying switching signals may be generated by the synthesizer, although the scope of the embodiments is not limited in this respect.

In some embodiments, the LO signals may differ in the duty cycle (the percentage of one period in which the LO signal is high) and/or offset (the difference between start points of the period). In some embodiments, the LO signals may have a 25% duty cycle and a 50% offset. In some embodiments, each branch of the mixer circuitry (e.g., the in-phase (I) and quadrature-phase (Q) path) may operate at a 25% duty cycle, which may result in a significant reduction in power consumption.

The RF input signal 207 (FIG. 2) may comprise a balanced signal, although the scope of the embodiments is not limited in this respect. The I and Q baseband output signals may be provided to the low-noise amplifier, such as amplifier circuitry 306 (FIG. 3) or to filter circuitry 308 (FIG. 3).

In some embodiments, the output baseband signals 307 and the input baseband signals 311 may be analog, although the scope of the embodiments is not limited in this respect. In some alternate embodiments, the output baseband signals 307 and the input baseband signals 311 may be digital. In these alternate embodiments, the radio IC circuitry may include an analog-to-digital converter (ADC) and digital-to-analog converter (DAC) circuitry.

In some dual-mode embodiments, a separate radio IC circuitry may be provided for processing signals for each spectrum, or for other spectrums not mentioned here, although the scope of the embodiments is not limited in this respect.

In some embodiments, the synthesizer circuitry 304 may be a fractional-N synthesizer or a fractional N/N+1 synthesizer, although the scope of the embodiments is not limited in this respect as other types of frequency synthesizers may be suitable. In some embodiments, the synthesizer circuitry 304 uses one or more of the disclosed techniques for frequency estimation (e.g., the frequency estimation techniques discussed in connection with FIGS. 5-12). In some embodiments, the synthesizer circuitry 304 may be a delta-sigma synthesizer, a frequency multiplier, or a synthesizer comprising a phase-locked loop with a frequency divider. According to some embodiments, the synthesizer circuitry 304 may include a digital frequency synthesizer circuitry, such as the digital frequency synthesizer using the disclosed techniques and discussed in connection with FIG. 5. An advantage of using a digital synthesizer circuitry is that, although it may still include some analog components, its footprint may be scaled down much more than the footprint of an analog synthesizer circuitry. In some embodiments, frequency input into synthesizer circuitry 304 may be provided by a voltage controlled oscillator (VCO), although that is not a requirement. A divider control input may further be provided by either the baseband processing circuitry 108 (FIG. 1) or the application processor 111 (FIG. 1) depending on the desired output frequency 305. In some embodiments, a divider control input (e.g., N) may be determined from a look-up table (e.g., within a Wi-Fi card) based on a channel number and a channel center frequency as determined or indicated by the application processor 111.

In some embodiments, synthesizer circuitry 304 may be configured to generate a carrier frequency as the output frequency 305, while in other embodiments, the output frequency 305 may be a fraction of the carrier frequency (e.g., one-half the carrier frequency, one-third the carrier frequency). In some embodiments, the output frequency 305 may be a LO frequency (fLO).

Figure 4:
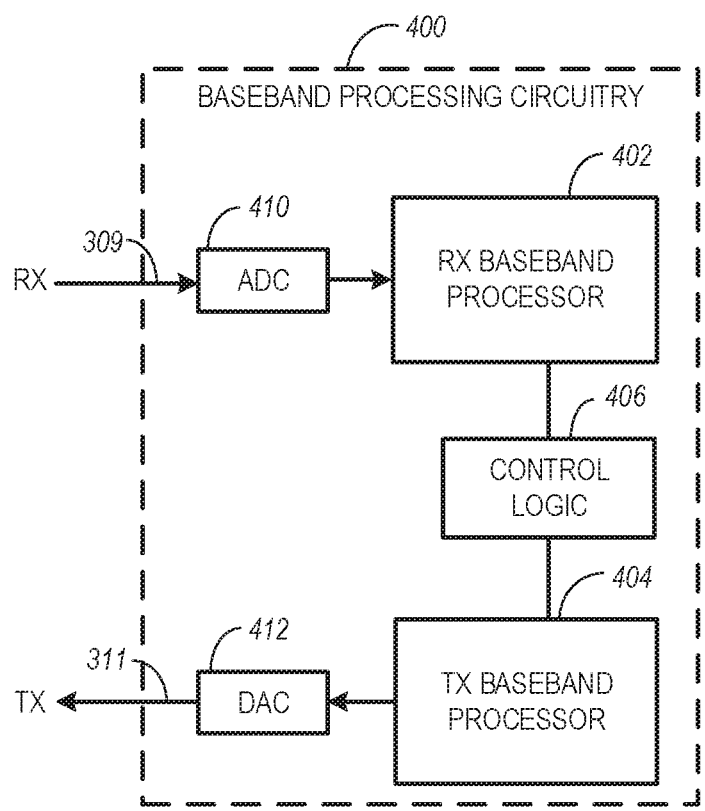
FIG. 4 illustrates a baseband processing circuitry for use in the radio architecture of FIG. 1, in accordance with some embodiments.

FIG. 4 illustrates a functional block diagram of baseband processing circuitry 400 in accordance with some embodiments. The baseband processing circuitry 400 is one example of circuitry that may be suitable for use as the baseband processing circuitry 108 (FIG. 1), although other circuitry configurations may also be suitable. The baseband processing circuitry 400 may include a receive baseband processor (RX BBP) 402 for processing receive baseband signals 309 provided by the radio IC circuitry 106 (FIG. 1) and a transmit baseband processor (TX BBP) 404 for generating transmit baseband signals 311 for the radio IC circuitry 106. The baseband processing circuitry 400 may also include control logic 406 for coordinating the operations of the baseband processing circuitry 400.

In some embodiments (e.g., when analog baseband signals are exchanged between the baseband processing circuitry 400 and the radio IC circuitry 106), the baseband processing circuitry 400 may include ADC 410 to convert analog baseband signals received from the radio IC circuitry 106 to digital baseband signals for processing by the RX BBP 402. In these embodiments, the baseband processing circuitry 400 may also include DAC 412 to convert digital baseband signals from the TX BBP 404 to analog baseband signals.

In some embodiments that communicate OFDM signals or OFDMA signals, such as through the baseband processing circuitry 108A, the TX BBP 404 may be configured to generate OFDM or OFDMA signals as appropriate for transmission by performing an inverse fast Fourier transform (IFFT). The RX BBP 402 may be configured to process received OFDM signals or OFDMA signals by performing an FFT. In some embodiments, the RX BBP 402 may be configured to detect the presence of an OFDM signal or OFDMA signal by performing an autocorrelation, to detect a preamble, such as a short preamble, and by performing a cross-correlation, to detect a long preamble. The preambles may be part of a predetermined frame structure for Wi-Fi communication.

Referring back to FIG. 1, in some embodiments, the one or more antennas 101 (FIG. 1) may each comprise one or more directional or omnidirectional antennas, including, for example, dipole antennas, monopole antennas, patch antennas, loop antennas, microstrip antennas or other types of antennas suitable for transmission of RF signals. In some multiple-input multiple-output (MIMO) embodiments, the antennas may be effectively separated to take advantage of spatial diversity and the different channel characteristics that may result. The one or more antennas 101 may each include a set of phased-array antennas, although embodiments are not so limited.

Although the radio architecture 100 is illustrated as having several separate functional elements, one or more of the functional elements may be combined and may be implemented by combinations of software configured elements, such as processing elements including digital signal processors (DSPs), and/or other hardware elements. For example, some elements may comprise one or more microprocessors, DSPs, field-programmable gate arrays (FPGAs), application-specific integrated circuits (ASICs), radio-frequency integrated circuits (RFICs), and combinations of various hardware and logic circuitry for performing at least the functions described herein. In some embodiments, the functional elements may refer to one or more processes operating on one or more processing elements.

Figure 5:
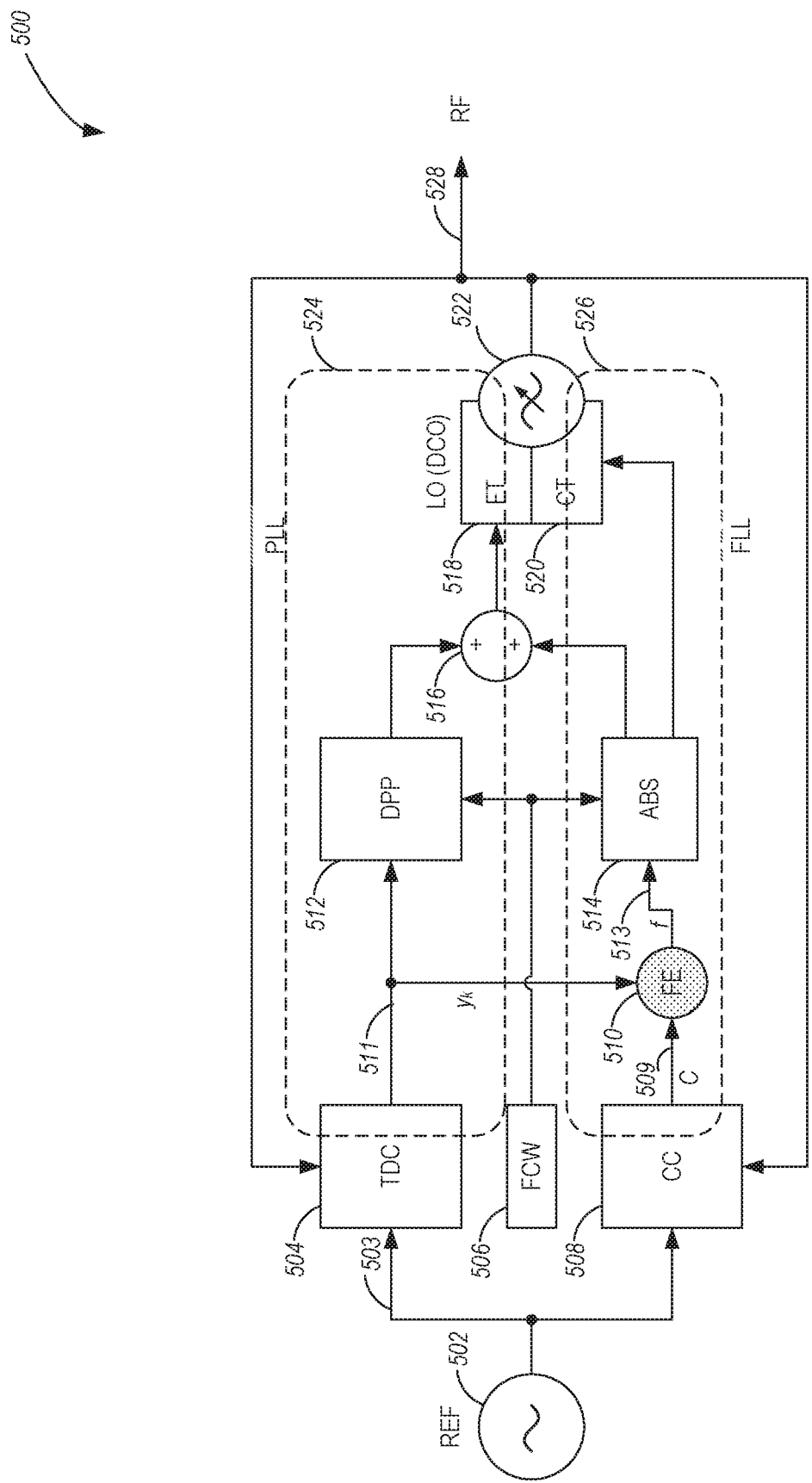
FIG. 5 illustrates a schematic diagram of a digital frequency synthesizer configured to perform frequency estimation using one or more of the disclosed techniques, in accordance with some embodiments.

FIG. 5 illustrates a schematic diagram of a digital frequency synthesizer (DFS) 500 configured to perform frequency estimation using one or more of the disclosed techniques, in accordance with some embodiments. Referring to FIG. 5, the DFS 500 includes a reference signal generator 502, a time-to-digital converter (TDC) 504, a cycle counter (CC) 508, frequency estimator (FE) (also referred to as frequency estimation circuitry) 510, a digital phase processor (DPP) 512, an automatic band selector (ABS) 514, an adder 516, a local oscillator (LO) (or digitally controlled oscillator (DCO)) 522, fine-tuning (FT) circuitry 518, and coarse tuning (CT) circuitry 520.

The DFS 500 is configured with a phase-locked loop (PLL) 524 and a frequency locked loop (FLL) 526. The PLL 524 is configured to include the TDC 504, the DPP 512, the adder 516, the FT circuitry 518, and the DCO 522. The FLL 526 is configured to include the CC 508, the FE 510, the ABS 514, the adder 516, the CT circuitry 520, and the DCO 522.

The reference signal generator 502 comprises suitable circuitry, logic, interfaces, and/or code and is configured to generate a reference clock signal 503.

The TDC 504 is communicatively coupled to the reference signal generator 502 and the FE 510. The TDC 504 comprises suitable circuitry, logic, interfaces, and/or code and is configured to receive an output signal (e.g., RF output signal 528) and the reference clock signal 503, and generate a plurality of time-to-digital conversion phase samples ($y_k$) 511 based on the output signal 528 and the reference clock signal 503.

The CC 508 is communicatively coupled to the reference signal generator 502 and the FE 510. The CC 508 comprises suitable circuitry, logic, interfaces, and/or code and is configured to receive the output signal 528 and the reference clock signal 503, and generate the clock cycle count (C) 509 based on the output signal 528 and the reference clock signal 503.

The FE 510 is communicatively coupled to the TDC 504 and the CC 508. The FE 510 comprises suitable circuitry, logic, interfaces, and/or code and is configured to generate a cycle count based frequency estimation of the output signal based on the reference clock signal 503 and the clock cycle count 509 of the output signal 528. The FE 510 is further configured to generate a fractional frequency estimation of the output signal based on the reference clock signal 503 and the plurality of time-to-digital conversion phase samples 511 of the output signal. The FE 510 is further configured to generate a combined frequency estimation 513 of the output signal 528 using the cycle count based frequency estimation and the fractional frequency estimation.

In some aspects, the TDC 504 generates the plurality of time-to-digital conversion phase samples 511 concurrently with the CC 508 generating the clock cycle count 509. In some aspects, the FE 510 is configured to generate the cycle count based frequency estimation using the clock cycle count 509 and a number of reference clock cycles of the reference signal generator 502. In some aspects, the cycle count based frequency estimation includes an integer frequency component and a fractional frequency component. In some aspects, the FE 510 is configured to generate the fractional frequency estimation based on the number of reference clock cycles of the reference signal generator and the plurality of time-to-digital conversion phase samples 511 of the output signal. In some aspects, the FE 510 is configured to generate the fractional frequency estimation further based on the gain of the TDC.

In some aspects, the FE 510 is configured to determine a frequency error based on a difference between the fractional frequency estimation and the fractional frequency component of the cycle count based frequency estimation. In some aspects, the FE 510 is configured to generate the combined frequency estimation 513 of the output signal using the cycle count based frequency estimation and the frequency error. A more detailed description of functionalities associated with the generation of the combined frequency estimation 513 is provided in connection with FIGS. 6-11.

In some embodiments, the frequency control word (FCW) 506 in the DFS 500 dictates the desired frequency ratio between the signal produced by the DCO 522 and the reference clock (REF) signal 503 from the reference signal generator 502. A PLL (such as PLL 524) is often a system of choice for achieving the above which can include digital implementations. In such a system, the TDC 504 measures the relative phase between the DCO signal and the reference clock signal 503 and uses the DPP to compute the required frequency shifts.

As in most modern radios, since the DCO is required to cover a considerable bandwidth, the control is broken down into the following several segments, along the lines of frequency shift they are designed to introduce:

CT circuitry 520 is responsible for controlling large frequency shifts of the DCO (commonly termed bands). This setting may be kept constant during phase-lock; and FT circuitry 518 is responsible for controlling minute frequency shifts of the DCO which are needed to maintain phase-lock over time.

The regular mode of operation of the DFS 500 may also be divided along the lines of the above segmentation to acquisition and tracking stages.

In an example acquisition stage, the best suitable band (CT) and the relevant region (FT) are found, usually with a help of an auxiliary frequency locked loop (FLL) 526 controlled by the ABS 514. Then the PLL 524 is released for operation, locking to the phase dictated by the reference signal. The latter is achieved with FT only.

During an example tracking stage, the phase is continuously measured and juxtaposed to the required value, with every discrepancy resulting in a command that eventually changes the FT.

The main input of the ABS 514 is the current frequency estimate 513 availed by the FE 510 and derived from an ensemble of TDC samples and the result provided by the CC 508 employing the frequency estimation techniques described herein (e.g., in connection with FIGS. 6-11).

Figure 6:
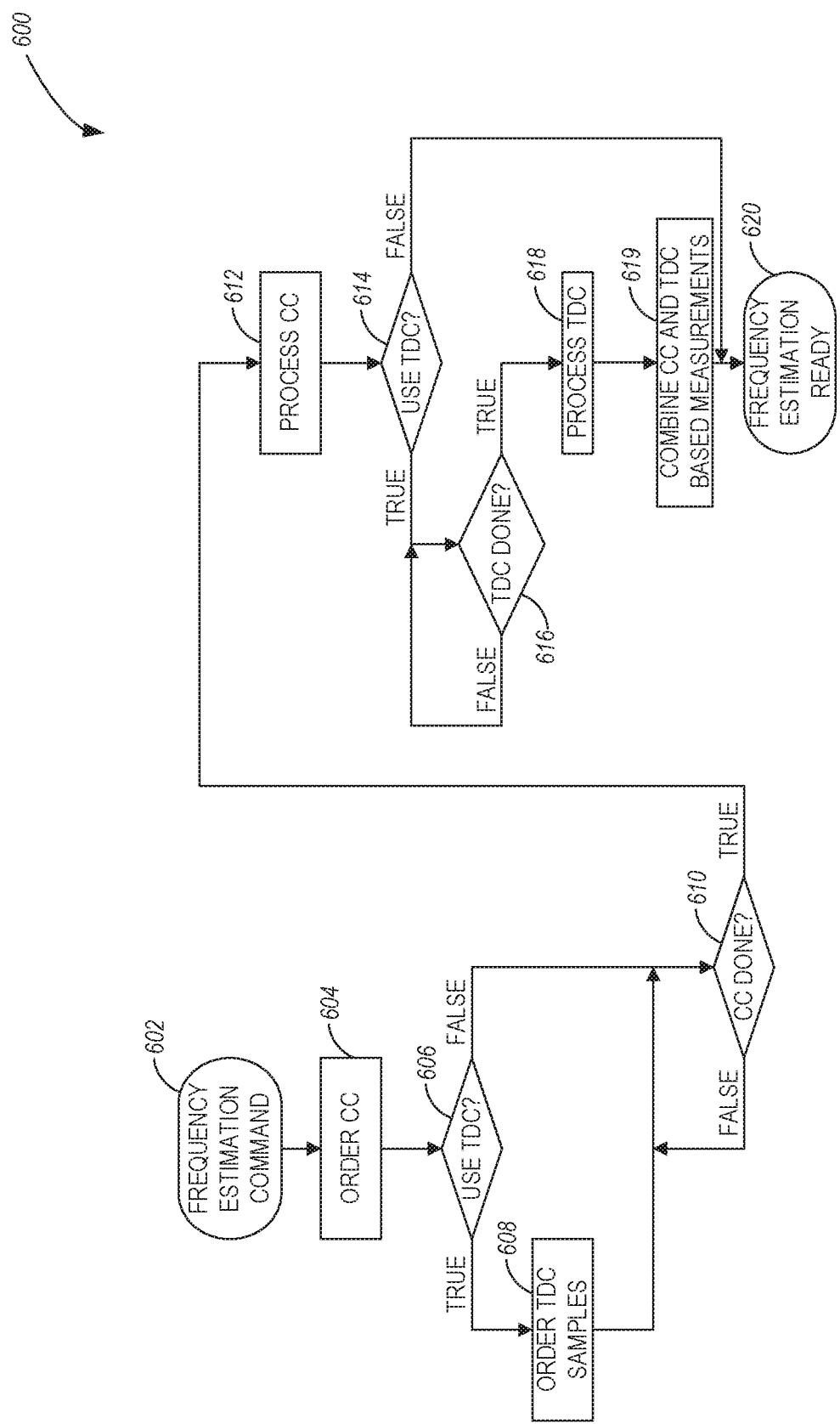
FIG. 6 is a flow diagram of a method for frequency estimation, in accordance with some embodiments.

FIG. 6 is a flow diagram of a method 600 for frequency estimation, in accordance with some embodiments. Referring to FIG. 6, the example method 600 includes operations 602-620 which may be performed by synthesizer circuitry, such as the synthesizer circuitry 304 (FIG. 3) or the digital frequency synthesizer 500 (FIG. 5). At operation 602, a frequency estimation command is generated (e.g., by the FE 510). At operation 604, a clock cycle count is ordered (e.g., for execution by the CC 508). At operation 606, a determination is made on whether the synthesizer circuitry uses a TDC. If the synthesizer circuitry uses a TDC, processing continues at operation 608 when TDC samples (e.g., time-to-digital conversion phase samples ($y_k$) 511) are ordered and processing continues to operation 610. If the synthesizer circuitry does not use a TDC, processing continues at operation 610 when it is determined if the clock cycle count is completed. If the clock cycle count is completed, processing continues at operation 612 when the ordered clock cycle count is processed (e.g., based on the processing functionalities discussed hereinbelow). At operation 614, a determination is made on whether the synthesizer circuitry uses a TDC. If the synthesizer circuitry does not use a TDC, processing continues at operation 620 when the frequency estimation (e.g., frequency estimation 513) is generated. If the synthesizer circuitry uses a TDC, processing continues at operation 616 when it is determined if the TDC samples are obtained. If the TDC samples are obtained, processing continues at operation 618 when the TDC samples are processed (e.g., based on the processing functionalities discussed hereinbelow). At operation 619, the TDC and CC based measurements (e.g., measurements using the clock cycle count and the TDC samples) may be combined to obtain a total frequency estimation (e.g., frequency estimation 513) of an output signal (e.g., signal 528).

In some embodiments, both estimators (namely the CC 508 and the TDC 504) operate simultaneously (if the TDC 504 is enabled for operation within the digital frequency synthesizer). The estimated normalized (to $f_{ref}$) frequency (of the device-under-test (DUT) signal such as output signal 528) is hence the following cycle count based frequency estimation:

$$\hat{F}_{cc} = \frac{C}{K} = N_{cc} + f_{cc},$$

where C is the clock cycle count 509 (generated by the CC 508) and K is the number of reference clock cycles of the reference signal generator 502 spent on the measurement. The cycle count based frequency estimation $\hat{F}_{CC}$ includes an integer frequency component $N_{CC}$ and a fractional frequency component $f_{CC}$.

Upon availability of an ensemble of K TDC phase samples (denoted by $y_k$, $k \in [1, k]$) the fractional frequency estimation of the output signal based on these samples can be given by the following equation:

$$\hat{f}_{TDC} = \frac{6}{P \cdot K(K^2 - 1)} \cdot \sum_{k=1}^{K} (2k - K - 1) \cdot y_k,$$

where P is the TDC gain. Therefore, the later estimation (of the fractional frequency derived from the TDC) can be used to enhance the precision of the former (the normalized frequency estimation due to CC alone) through the following equation for a total (or combined) frequency estimation of the output signal:

$$\hat{F}_{tot} = \hat{F}_{cc} + \text{mod}\left(\frac{\hat{f}_{TDC} - f_{cc}}{f_{err}} + \frac{1}{2}, 1\right) - \frac{1}{2},$$

where $f_{err}$ is a frequency error based on a difference between the fractional frequency estimation and the fractional frequency component of the cycle count based frequency estimation.

Figure 7A:
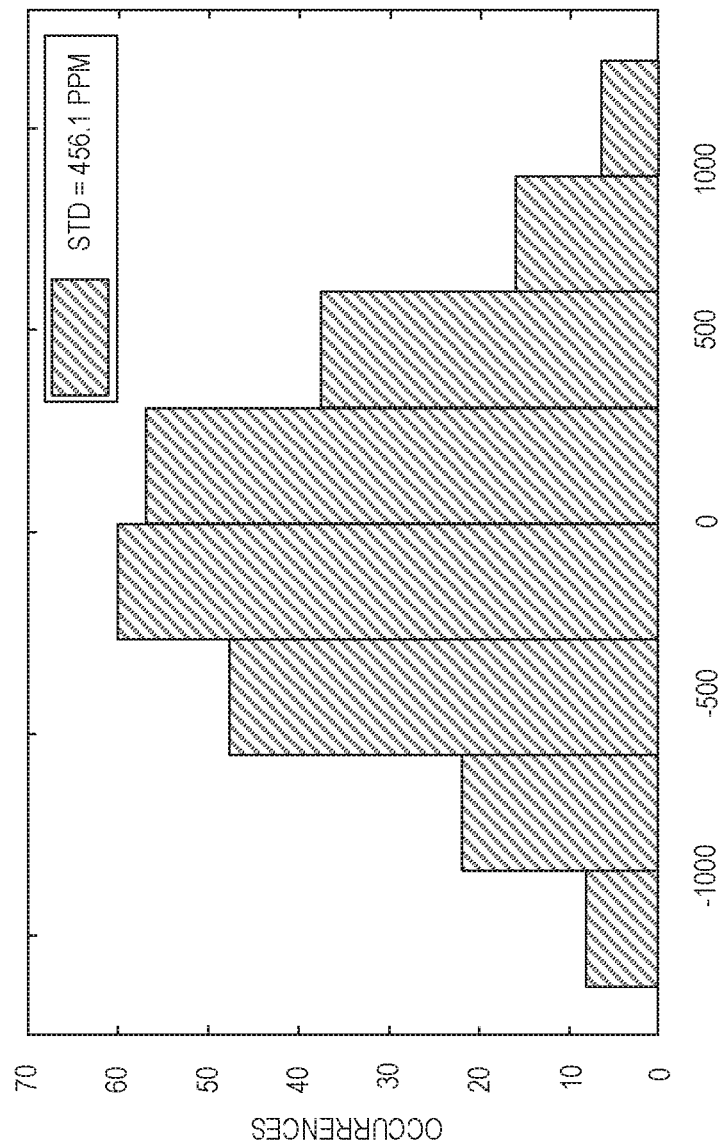
FIG. 7A and FIG. 7B illustrate graphs of estimation errors associated with frequency estimation using the disclosed techniques, in accordance with some embodiments.
Figure 7B:
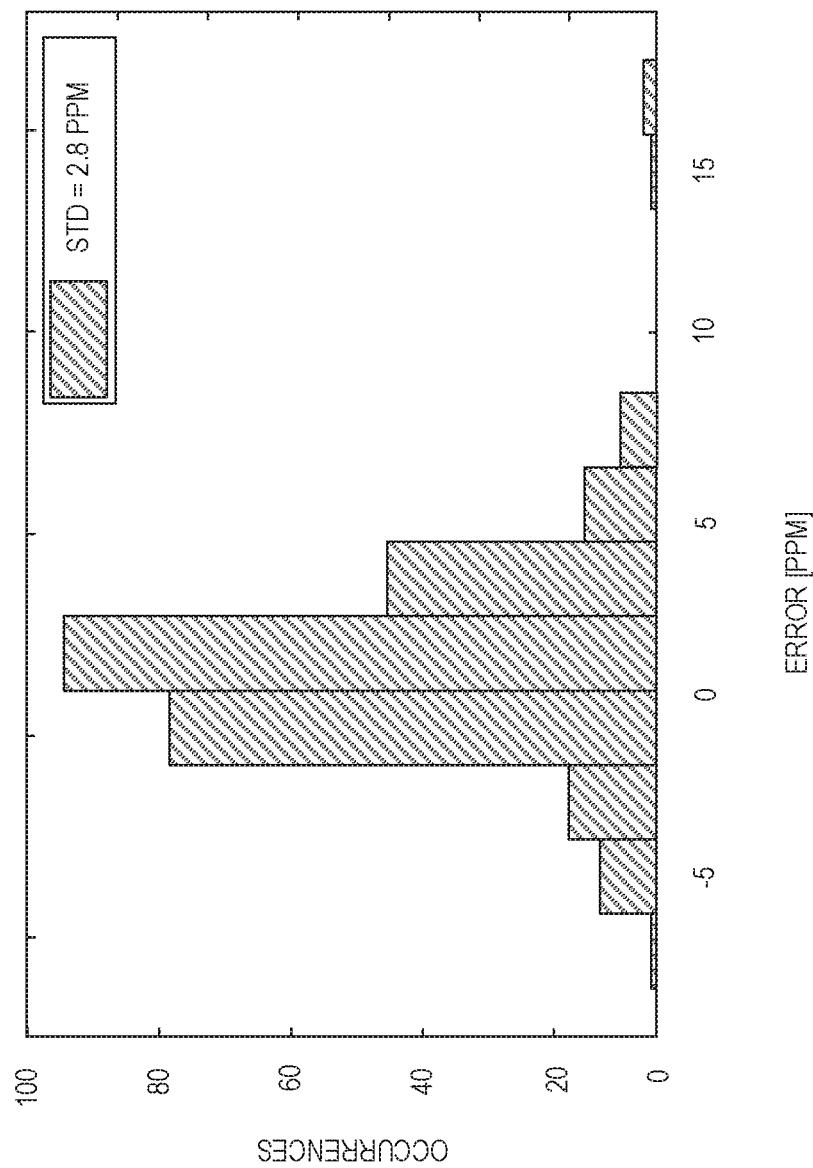

FIG. 7A and FIG. 7B illustrate graphs 700 and 702 of estimation errors associated with frequency estimation using the disclosed techniques, in accordance with some embodiments. More specifically, FIGS. 7A and 7B show a histogram based on 256 such measurements, where in FIG. 7A, the frequency estimation is due to CC alone (using K=16), and in FIG. 7B, the TDC based fractional frequency estimation (also with K=16, of course) was used to augment the former.

Figure 8:
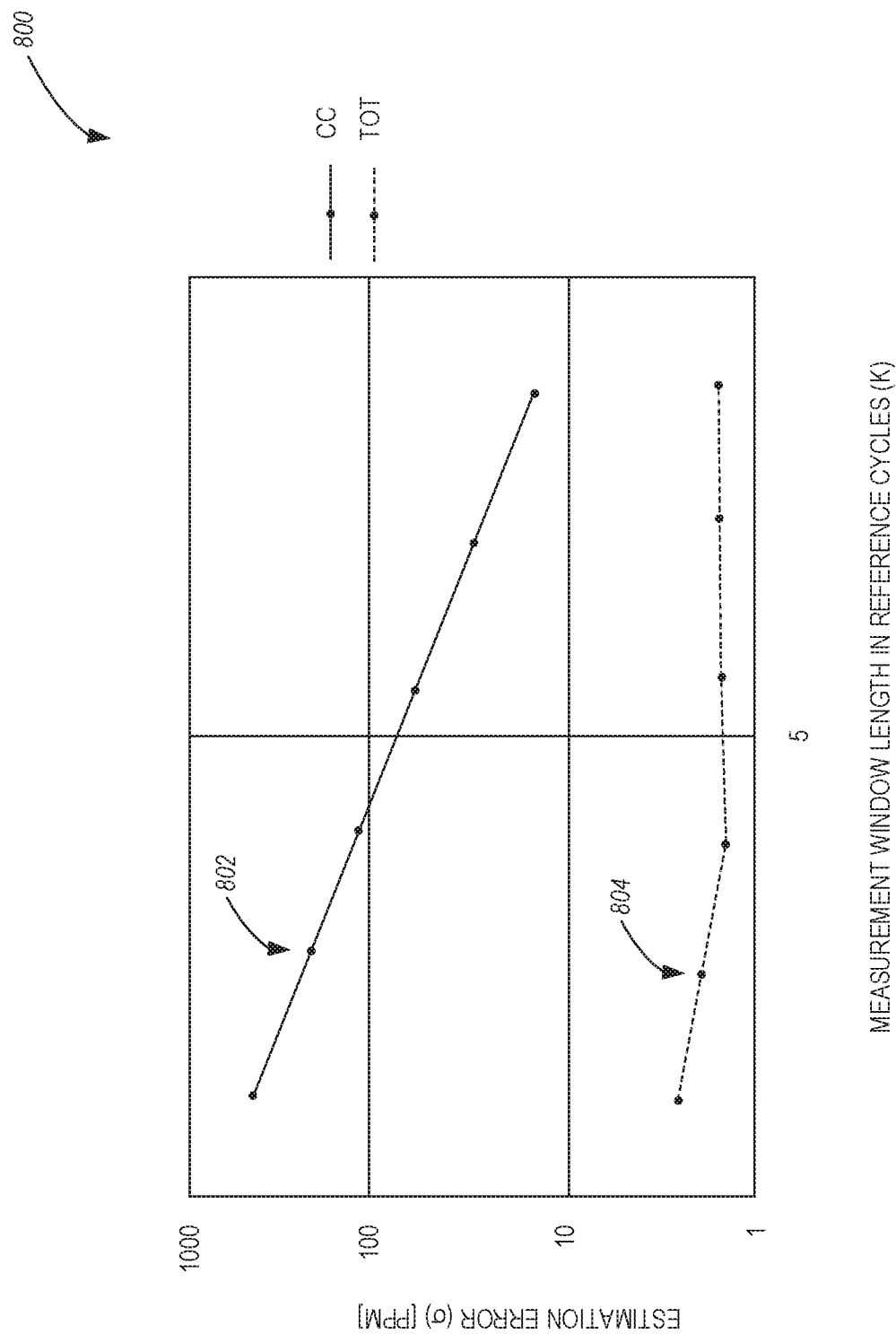
FIG. 8 illustrates estimation errors versus measurement length associated with frequency estimation using the disclosed techniques, in accordance with some embodiments.

FIG. 8 illustrates a diagram 800 of estimation errors versus measurement length associated with frequency estimation using the disclosed techniques, in accordance with some embodiments. Repeating the experiment for a swept (in two-fold increment) K yields graphs 802 and 804 in FIG. 8. It is evident from FIG. 8 that as analytically proven in the discussions below associated with FIG. 9 and FIG. 10, the combined frequency estimation (using both the CC and the TDC) is superior to CC only measurement even for the shortest of measurement lengths. At larger measurement lengths, a signal noise-induced floor limits the obtainable error, signifying the achievement of the theoretical measurement level.

In an example embodiment associated with frequency estimation, assuming signal of frequency given by v, the output of a CC is given as follows:

$C = \lfloor v \cdot T_{meas} \rfloor$, where $T_{meas}$ is usually a number (K) of reference clock cycles (frequency $f_{ref}$). Therefore, the following equation results:

$$C = \left\lfloor v \cdot \frac{K}{f_{ref}} \right\rfloor = K \cdot \underbrace{\frac{v}{f_{ref}}}_{F} + \Delta C,$$

where $\Delta C$ is the measurement (quantization) noise ($\Delta C \sim U[-1,1]$) introduced by the CC (since only full cycles count). The estimated normalized (to $f_{ref}$) frequency (of the DUT/output signal) is hence expressed by the following equation:

$$\hat{F}_{cc} = \frac{C}{K} - \frac{\Delta C}{K}.$$

In some aspects, the standard deviation of the estimation is expressed by the following equation:

$$std(\hat{F}_{cc}) = \frac{1}{\sqrt{6}K}.$$

Therefore, the resolution (and alongside it the measurement error, until the variations of f itself become dominant) improves with the number of reference clocks spent on the measurement.

The unperturbed phase evolution path of the output signal can be described by the following equation:

$\varphi(t) = 2\pi \cdot v \cdot t + \theta_0.$

Sampled by the TDC directly at a rate of $f_{ref}$ (sample interval of $T_{ref} = f_{ref}^{-1}$) the phase samples are given by the following equation:

$$y_k = \frac{P}{2\pi} \cdot \varphi(t = kT_{ref} + q_k) = P \cdot v \cdot (kT_{ref} + q_k) + \underbrace{\frac{P}{2\pi} \cdot \theta_0}_{y_0} = P\frac{v}{f_{ref}}k + y_0 + P \cdot v \cdot q_k,$$

where $$\frac{P}{2\pi}$$

is the TDC gain and $q_k$ is the quantization noise in seconds within the k-th sample. Due to the small dynamic range of the TDC, a single period of the DUT signal is generally observable, and hence the information of the number of full cycles occurring in the sampling interval (N) is lost, hence in the context of the samples, only the fractional frequency part of the normalized frequency (f) is observed as follows:

$$F \triangleq \frac{v}{f_{ref}} = N + f.$$

The sampled phase is therefore given by the following equation:

$y_k = f \cdot P \cdot k + y_0 + v \cdot P \cdot q_k.$

Denoted f·P, this normalized fractional frequency can be estimated out of the acquired samples (under certain assumptions) through a Maximum Likelihood or Minimum Mean Square Error types of algorithms. In the Gaussian noise case, both yield identical result as follows:

$$\widehat{f \cdot P} = \frac{6}{K(K^2 - 1)} \cdot \sum_{k=1}^{K} (2k - K - 1) \cdot y_k.$$

The variance of this estimation due to resolution related (quantization) errors is as follows:

$$var(\widehat{f \cdot P}) = \frac{12}{K(K^2 - 1)} var(P \cdot v \cdot q_k).$$

For a uniformly distributed quantization error, $$q_k \sim U\left[-\frac{\Delta T}{2}, \frac{\Delta T}{2}\right],$$

where $\Delta T$ is the TDC resolution, $$var(q_k) = \frac{(P \cdot v \cdot \Delta T)^2}{12}$$

and hence after dividing by the TDC gain, the standard deviation of the normalized fractional frequency (f) would be expressed as follows:

$$std(\hat{f}_{TDC}) = \frac{v \cdot \Delta T}{\sqrt{K(K^2-1)}} = \frac{1}{\sqrt{6}K} \cdot \frac{\sqrt{6} \cdot v \cdot \Delta T}{\sqrt{K-K^{-1}}}.$$

Consequently, since for any practical TDC, v·ΔT<<1, the error is significantly smaller than that of standalone CC estimation (fromK>1) and continues to increase the gap for the increase of K.

In some aspects, since the estimation does not yield any information on the frequency integer (N), frequency ambiguity may be a relevant consideration. However, if both measurements (CC and TDC based measurements) are available simultaneously, the former can be used to disambiguate the later. This concept is s depicted in FIG. 9 and FIG. 10.

Figure 9:
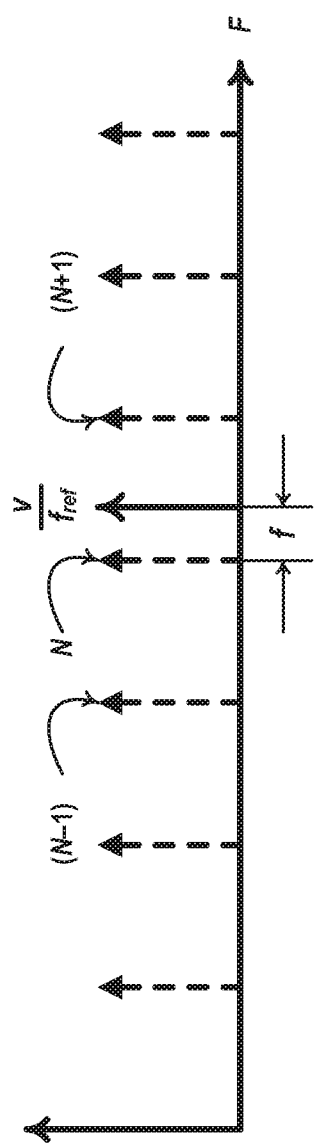
FIG. 9 illustrates band sampling of signal frequency associated with frequency estimation using the disclosed techniques, in accordance with some embodiments.
Figure 10:
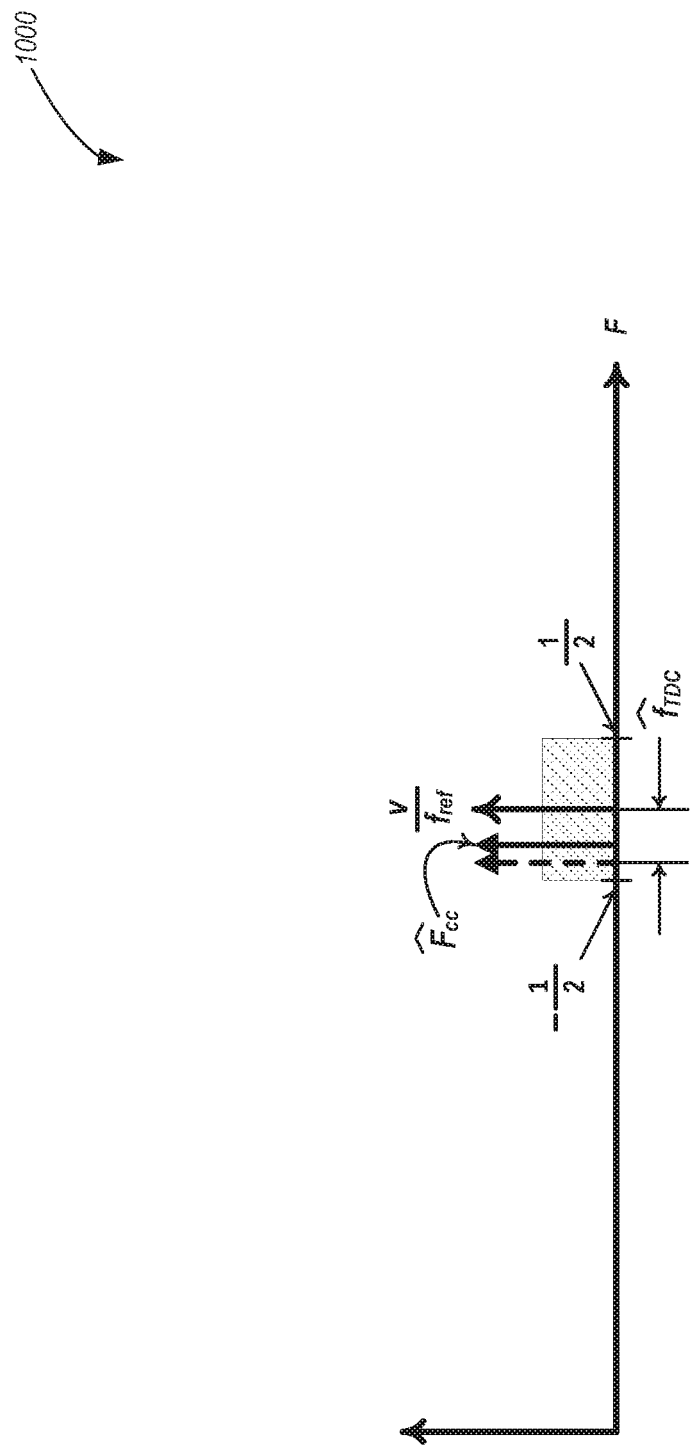
FIG. 10 illustrates different estimation results associated with frequency estimation using the disclosed techniques, in accordance with some embodiments.

FIG. 9 illustrates a diagram 900 of band sampling of signal frequency associated with frequency estimation using the disclosed techniques, in accordance with some embodiments. FIG. 10 illustrates a diagram 1000 of different estimation results associated with frequency estimation using the disclosed techniques, in accordance with some embodiments.

Referring to FIG. 9, band-sampling the frequency v at a much lower rate $f_{ref}$, degenerates the amount of information available to the relative distance between the sampled signal frequency and the closest sampling delta (the integer part of the sampled frequency, N), the f. However, if the CC based estimate is available, and it is sufficient to firmly reside within the Nyquist range of the signal frequency v (e.g., as shown by the patterned area in FIG. 10), the TDC based fractional frequency estimation can be used to update the CC based estimation.

Assuming the estimation error of the TDC is much smaller than that of the CC, the simplest update strategy would be to simply overwrite the fractional information derived by the CC. Stipulating that the CC estimate is given by the following equation:

$\hat{F}_{CC} = N_{CC} + f_{CC}$, the error between the TDC based fraction ($\hat{f}_{TDC}$) and the CC based fraction ($f_{CC}$) is given by the following equation:

$$f_{err} = \hat{f}_{TDC} - f_{cc}.$$

Therefore, enforcing the Nyquist criteria (namely, the error should reside within the [−½, +½] range), the combined estimate would be given by the following equation:

$$\hat{F}_{tot} = \hat{F}_{cc} + \text{mod}\left(\underbrace{\hat{f}_{TDC} - f_{cc}}_{f_{err}} + \frac{1}{2}, 1\right) - \frac{1}{2},$$

which is the equation associated with the frequency estimation techniques discussed hereinabove.

Figure 11:
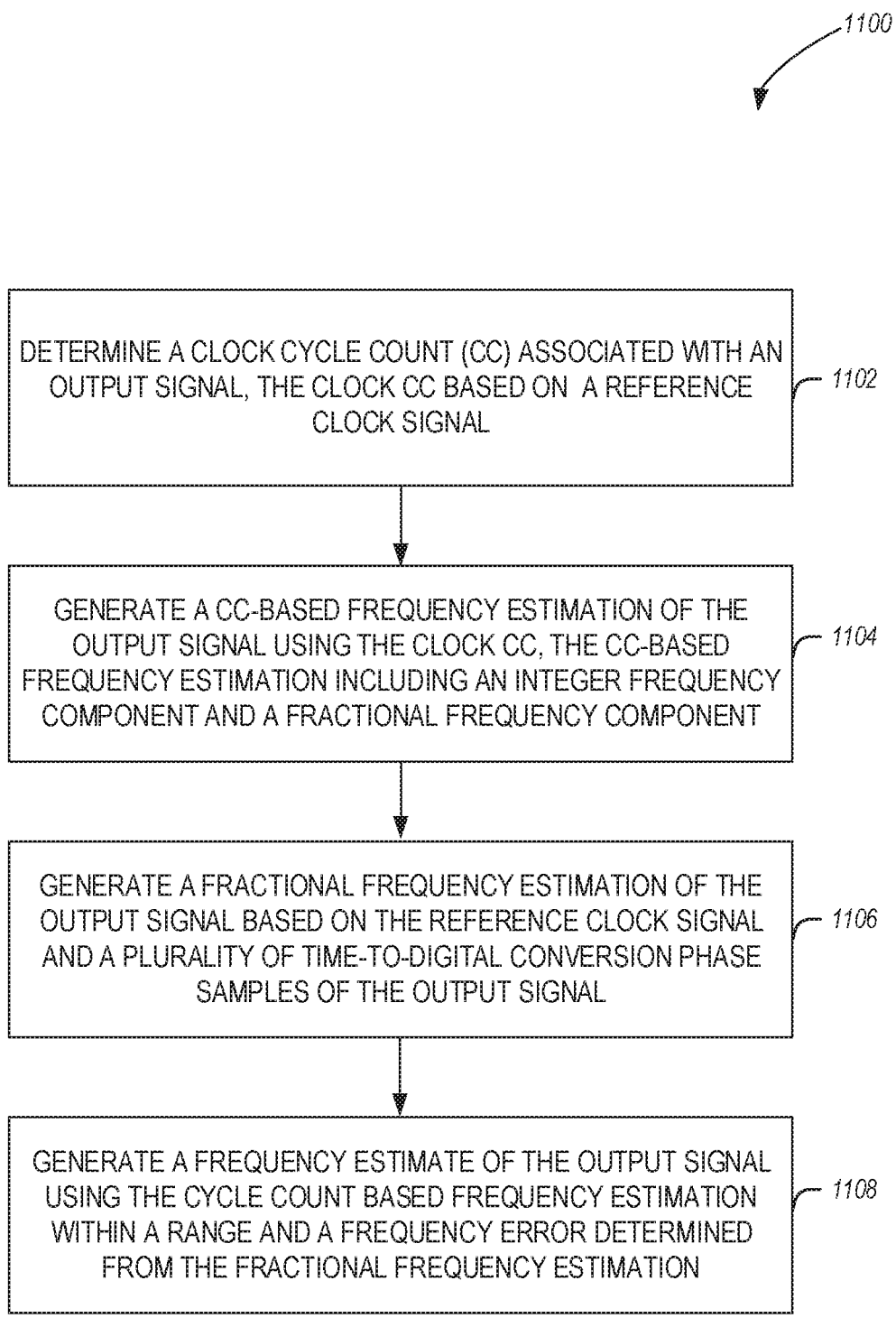
FIG. 11 is a flow diagram of another method for frequency estimation, in accordance with some embodiments.

FIG. 11 is a flow diagram of another method 1100 for frequency estimation, in accordance with some embodiments. Referring to FIG. 11, the example method 1100 includes operations 1102, 1104, 1106, and 1108 which may be performed by synthesizer circuitry (e.g., the synthesizer circuitry 304 in FIG. 3 or the digital frequency synthesizer 500 of FIG. 5). At operation 1102, a clock cycle count associated with an output signal is determined. For example, the CC 508 determines a clock cycle count 509 based on a reference clock signal 503 (e.g., based on a number of reference clock cycles of the reference clock signal).

At operation 1104, a cycle count based frequency estimation of the output signal is generated using the clock cycle count. For example, the FE 510 generates the cycle count based frequency estimation $$\hat{F}_{cc} = \frac{C}{K} = N_{cc} + f_{cc},$$

where C is the clock cycle count 509 (generated by the CC 508) and K is the number of reference clock cycles of the reference signal generator 502 spent on the measurement. The cycle count based frequency estimation $\hat{F}_{CC}$ includes an integer frequency component $N_{CC}$ and a fractional frequency component $f_{CC}$.

At operation 1106, a fractional frequency estimation of the output signal is generated based on the reference clock signal and a plurality of time-to-digital conversion phase samples of the output signal. For example, upon the availability of an ensemble of K TDC phase samples 511 of the TDC 504 (denoted by $y_k$, k∈[1, k]), the fractional frequency estimation of the output signal based on these samples can be given by the following equation:

$$\hat{f}_{TDC} = \frac{6}{P \cdot K(K^2-1)} \cdot \sum_{k=1}^{K}(2k - K - 1) \cdot y_k,$$

where P is the TDC gain.

At operation 1108, a frequency estimate of the output signal is generated using the cycle count based frequency estimation within a range (e.g., a Nyquist range) and a frequency error determined from the fractional frequency estimation. The plurality of time-to-digital conversion phase samples and the cycle count based frequency estimation uses the same number of reference clock cycles of the reference clock signal, and the range is selected based on the frequency error.

For example, the fractional frequency estimation derived from the TDC phase samples can be used to enhance the precision of the cycle count based frequency estimation through the following equation for a total (or combined) frequency estimation of the output signal:

$$\hat{F}_{tot} = \hat{F}_{cc} + \text{mod}\left(\underbrace{\hat{f}_{TDC} - f_{cc}}_{f_{err}} + \frac{1}{2}, 1\right) - \frac{1}{2},$$

where $f_{err}$ is a frequency error based on a difference between the fractional frequency estimation and the fractional frequency component of the cycle count based frequency estimation.

Figure 12:
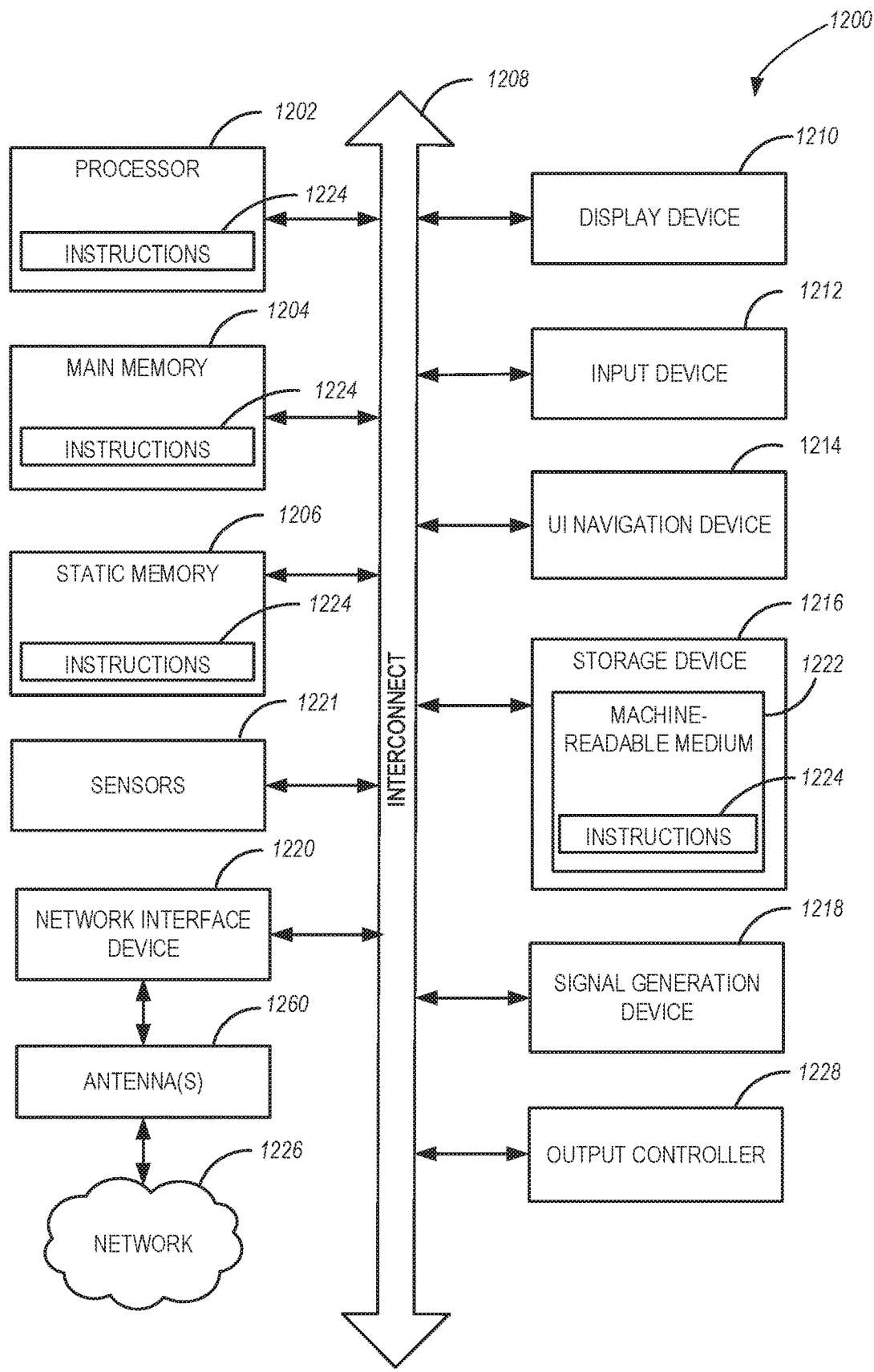
FIG. 12 illustrates a block diagram of an example machine upon which any one or more of the operations/techniques (e.g., methodologies) discussed herein may perform.

FIG. 12 illustrates a block diagram of an example machine 1200 upon which any one or more of the techniques (e.g., methodologies) discussed herein may perform. In alternative embodiments, the machine 1200 may operate as a standalone device or may be connected (e.g., networked) to other machines. In a networked deployment, the machine 1200 may operate in the capacity of a server machine, a client machine, or both in server-client network environments. In an example, the machine 1200 may act as a peer machine in a peer-to-peer (P2P) (or other distributed) network environment. The machine 1200 may be a personal computer (PC), a tablet PC, a set-top box (STB), a personal digital assistant (PDA), a portable communications device, a mobile telephone, a smartphone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Machine (e.g., computer system) 1200 may include a hardware processor 1202 (e.g., a central processing unit (CPU), a graphics processing unit (GPU), a hardware processor core, or any combination thereof), a main memory 1204, and a static memory 1206, some or all of which may communicate with each other via an interlink (e.g., bus) 1208.

Specific examples of main memory 1204 include Random Access Memory (RAM), and semiconductor memory devices, which may include, in some embodiments, storage locations in semiconductors such as registers. Specific examples of static memory 1206 include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; RAM; and CD-ROM and DVD-ROM disks.

The machine 1200 may further include a display device 1210, an input device 1212 (e.g., a keyboard), and a user interface (UI) navigation device 1214 (e.g., a mouse). In an example, the display device 1210, input device 1212, and UI navigation device 1214 may be a touch screen display. The machine 1200 may additionally include a storage device (e.g., drive unit or another mass storage device) 1216, a signal generation device 1218 (e.g., a speaker), a network interface device 1220, and one or more sensors 1221, such as a global positioning system (GPS) sensor, compass, accelerometer, or other sensors. The machine 1200 may include an output controller 1228, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.). In some embodiments, the processor 1202 and/or instructions 1224 may comprise processing circuitry and/or transceiver circuitry.

The storage device 1216 may include a machine-readable medium 1222 on which is stored one or more sets of data structures or instructions 1224 (e.g., software) embodying or utilized by any one or more of the techniques or functions described herein. The instructions 1224 may also reside, completely or at least partially, within the main memory 1204, within static memory 1206, or within the hardware processor 1202 during execution thereof by the machine 1200. In an example, one or any combination of the hardware processor 1202, the main memory 1204, the static memory 1206, or the storage device 1216 may constitute machine-readable media.

Specific examples of machine-readable media may include non-volatile memory, such as semiconductor memory devices (e.g., EPROM or EEPROM) and flash memory devices; magnetic disks, such as internal hard disks and removable disks; magneto-optical disks; RAM; and CD-ROM and DVD-ROM disks.

While the machine-readable medium 1222 is illustrated as a single medium, the term "machine-readable medium" may include a single medium or multiple media (e.g., a centralized or distributed database, and/or associated caches and servers) configured to store the one or more instructions 1224.

An apparatus of the machine 1200 may be one or more of a hardware processor 1202 (e.g., a central processing unit (CPU), a graphics processing unit (GPU), a hardware processor core, or any combination thereof), a main memory 1204 and a static memory 1206, one or more sensors 1221, a network interface device 1220, antennas 1260, a display device 1210, an input device 1212, a UI navigation device 1214, a storage device 1216, instructions 1224, a signal generation device 1218, and an output controller 1228. The apparatus may be configured to perform one or more of the methods and/or operations disclosed herein. The apparatus may be intended as a component of the machine 1200 to perform one or more of the methods and/or operations disclosed herein, and/or to perform a portion of one or more of the methods and/or operations disclosed herein. In some embodiments, the apparatus may include a pin or other means to receive power. In some embodiments, the apparatus may include power conditioning hardware.

The term "machine-readable medium" may include any medium that is capable of storing, encoding, or carrying instructions for execution by the machine 1200 and that cause the machine 1200 to perform any one or more of the techniques of the present disclosure, or that is capable of storing, encoding or carrying data structures used by or associated with such instructions. Non-limiting machine-readable medium examples may include solid-state memories and optical and magnetic media. Specific examples of machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, machine-readable media may include non-transitory machine-readable media. In some examples, machine-readable media may include machine-readable media that is not a transitory propagating signal.

The instructions 1224 may further be transmitted or received over a communications network 1226 using a transmission medium via the network interface device 1220 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others.

In an example, the network interface device 1220 may include one or more physical jacks (e.g., Ethernet, coaxial, or phone jacks) or one or more antennas to connect to the communications network 1226. In an example, the network interface device 1220 may include one or more antennas 1260 to wirelessly communicate using at least one of single-input multiple-output (SIMO), multiple-input multiple-output (MIMO), or multiple-input single-output (MISO) techniques. In some examples, the network interface device 1220 may wirelessly communicate using Multiple User MIMO techniques. The term "transmission medium" shall be taken to include any intangible medium that is capable of storing, encoding, or carrying instructions for execution by the machine 1200, and includes digital or analog communications signals or other intangible media to facilitate communication of such software.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or concerning external entities such as other circuits) in a specified manner as a module. In an example, the whole or part of one or more computer systems (e.g., a standalone, client, or server computer system) or one or more hardware processors may be configured by firmware or software (e.g., instructions, an application portion, or an application) as a module that operates to perform specified operations. In an example, the software may reside on a machine-readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using the software, the general-purpose hardware processor may be configured as respective different modules at different times. The software may accordingly configure a hardware processor, for example, to constitute a particular module at one instance of time and to constitute a different module at a different instance of time.

Some embodiments may be implemented fully or partially in software and/or firmware. This software and/or firmware may take the form of instructions contained in or on a non-transitory computer-readable storage medium. Those instructions may then be read and executed by one or more processors to enable the performance of the operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read-only memory (ROM); random access memory (RAM); magnetic disk storage media; optical storage media; flash memory, etc.

The above-detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof) or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The embodiments as described above may be implemented in various hardware configurations that may include a processor for executing instructions that perform the techniques described. Such instructions may be contained in a machine-readable medium such as a suitable storage medium or a memory or other processor-executable medium.

The embodiments as described herein may be implemented in a number of environments such as part of a wireless local area network (WLAN), 3rd Generation Partnership Project (3GPP) Universal Terrestrial Radio Access Network (UTRAN), or Long-Term-Evolution (LTE) or a Long-Term-Evolution (LTE) communication system, although the scope of the disclosure is not limited in this respect.

Antennas referred to herein may comprise one or more directional or omnidirectional antennas, including, for example, dipole antennas, monopole antennas, patch antennas, loop antennas, microstrip antennas, or other types of antennas suitable for transmission of RF signals. In some embodiments, instead of two or more antennas, a single antenna with multiple apertures may be used. In these embodiments, each aperture may be considered a separate antenna. In some multiple-input multiple-output (MIMO) embodiments, antennas may be effectively separated to take advantage of spatial diversity and the different channel characteristics that may result between each of antennas and the antennas of a transmitting station. In some MIMO embodiments, antennas may be separated by up to $1/10$ of a wavelength or more.

Additional Notes and Examples

Example 1 is an apparatus to generate a frequency estimate of an output signal, the apparatus comprising: a reference signal generator configured to generate a reference clock signal; and frequency estimation circuitry configured to: generate a cycle count based frequency estimation of the output signal based on the reference clock signal and a clock cycle count of the output signal; generate a fractional frequency estimation of the output signal based on the reference clock signal and a plurality of time-to-digital conversion phase samples of the output signal; and generate the frequency estimate of the output signal using the cycle count based frequency estimation within a Nyquist range and a frequency error determined from the fractional frequency estimation, wherein the plurality of time-to-digital conversion phase samples and the cycle count based frequency estimation use a same number of reference clock cycles of the reference clock signal, and wherein the Nyquist range is selected based on the frequency error.

In Example 2, the subject matter of Example 1 includes, wherein the plurality of time-to-digital conversion phase samples are generated based on the output signal and the same number of reference clock cycles of the reference clock signal, and wherein the clock cycle count is generated concurrently with the time-to-digital conversion phase samples based on the same number of reference clock cycles of the reference clock signal.

In Example 3, the subject matter of Example 2 includes, wherein the frequency estimation circuitry is configured to generate the cycle count based frequency estimation using the clock cycle count and the number of reference clock cycles of the reference signal generator.

In Example 4, the subject matter of Example 3 includes, wherein the cycle count based frequency estimation includes an integer frequency component and a fractional frequency component, and wherein the frequency error is based on the fractional frequency component determined for the same number of reference clock cycles of the reference clock signal.

In Example 5, the subject matter of Example 4 includes, wherein the frequency estimation circuitry is configured to generate the fractional frequency estimation based on the number of reference clock cycles of the reference signal generator and the plurality of time-to-digital conversion phase samples of the output signal.

In Example 6, the subject matter of Example 5 includes, wherein the frequency estimation circuitry is configured to generate the fractional frequency estimation further based on a gain of a time-to-digital converter (TDC) generating the plurality of time-to-digital conversion phase samples.

In Example 7, the subject matter of Examples 5-6 includes, wherein the frequency estimation circuitry is configured to determine the frequency error based on a difference between the fractional frequency estimation and the fractional frequency component of the cycle count based frequency estimation.

In Example 8, the subject matter of Example 7 includes, wherein the frequency estimation circuitry is configured to perform a modulus operation on the frequency error to obtain the Nyquist range associated with the cycle count based frequency estimation; and generate the frequency estimate of the output signal by adjusting the fractional frequency component of the cycle count based frequency estimation within the obtained Nyquist range with the fractional frequency estimation.

In Example 9, the subject matter of Examples 1-8 includes, a time-to-digital-converter (TDC), the TDC configured to receive the output signal and the reference clock signal, and generate the plurality of time-to-digital conversion phase samples based on the output signal and the reference clock signal.

In Example 10, the subject matter of Example 9 includes, a cycle counter (CC), the CC configured to receive the output signal and the reference clock signal, and generate the clock cycle count based on the output signal and the reference clock signal.

Example 11 is a method for generating a frequency estimate of an output signal, the method comprising: determining a clock cycle count associated with the output signal, the clock cycle count based on a reference clock signal; generating a cycle count based frequency estimation of the output signal using the clock cycle count, the cycle count based frequency estimation including an integer frequency component and a fractional frequency component; generating a fractional frequency estimation of the output signal based on the reference clock signal and a plurality of time-to-digital conversion phase samples of the output signal; and generating the frequency estimate of the output signal using the cycle count based frequency estimation within a Nyquist range and a frequency error determined from the fractional frequency estimation, wherein the plurality of time-to-digital conversion phase samples and the cycle count based frequency estimation use a same number of reference clock cycles of the reference clock signal, and wherein the Nyquist range is selected based on the frequency error.

In Example 12, the subject matter of Example 11 includes, generating the plurality of time-to-digital conversion phase samples based on the output signal and the same number of reference clock cycles of the reference clock signal.

In Example 13, the subject matter of Example 12 includes, wherein the generating of the plurality of time-to-digital conversion phase samples takes place concurrently with the determining of the clock cycle count based on the same number of reference clock cycles of the reference clock signal.

In Example 14, the subject matter of Examples 11-13 includes, generating the fractional frequency estimation based on the same number of reference clock cycles of the reference clock signal and the plurality of time-to-digital conversion phase samples of the output signal.

In Example 15, the subject matter of Examples 11-14 includes, determining the frequency error based on a difference between the fractional frequency estimation and the fractional frequency component of the cycle count based frequency estimation.

Example 16 is a digital frequency synthesizer, comprising: a reference signal generator configured to generate a reference clock signal; a time-to-digital-converter (TDC), the TDC configured to receive an output signal and the reference clock signal, and generate a plurality of time-to-digital conversion phase samples based on the output signal and the reference clock signal; a cycle counter (CC), the CC configured to receive the output signal and the reference clock signal, and generate a clock cycle count based on the output signal and the reference clock signal; and a frequency estimator, the frequency estimator configured to: generate a cycle count based frequency estimation of the output signal based on the reference clock signal and the clock cycle count; generate a fractional frequency estimation of the output signal based on the reference clock signal and a plurality of time-to-digital conversion phase samples of the output signal; and generate a frequency estimate of the output signal using the cycle count based frequency estimation within a Nyquist range and a frequency error determined from the fractional frequency estimation, wherein the plurality of time-to-digital conversion phase samples and the cycle count based frequency estimation use a same number of reference clock cycles of the reference clock signal, and wherein the Nyquist range is selected based on the frequency error.

In Example 17, the subject matter of Example 16 includes, wherein the TDC generates the plurality of time-to-digital conversion phase samples concurrently with the CC generating the clock cycle count based on the same number of reference clock cycles of the reference clock signal.

In Example 18, the subject matter of Examples 16-17 includes, wherein the frequency estimator is configured to generate the cycle count based frequency estimation using the clock cycle count and the same number of reference clock cycles of the reference signal generator; wherein the cycle count based frequency estimation includes an integer frequency component and a fractional frequency component.

In Example 19, the subject matter of Example 18 includes, wherein the frequency estimator is configured to generate the fractional frequency estimation based on the number of reference clock cycles of the reference signal generator, the plurality of time-to-digital conversion phase samples of the output signal, and a gain of the TDC.

In Example 20, the subject matter of Examples 18-19 includes, wherein the frequency estimator is configured to determine the frequency error based on a difference between the fractional frequency estimation and the fractional frequency component of the cycle count based frequency estimation.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined regarding the appended claims, along with the full scope of equivalents to which such claims are entitled.

What is claimed is:

1. An apparatus to generate a frequency estimate of an output signal, the apparatus comprising:
a reference signal generator configured to generate a reference clock signal; and
frequency estimation circuitry configured to:
generate a cycle count based frequency estimation of the output signal based on the reference clock signal and a clock cycle count of the output signal;
generate a fractional frequency estimation of the output signal based on the reference clock signal and a plurality of time-to-digital conversion phase samples of the output signal; and
generate the frequency estimate of the output signal using the cycle count based frequency estimation within a range and a frequency error determined from the fractional frequency estimation,
wherein the plurality of time-to-digital conversion phase samples and the cycle count based frequency estimation use a same number of reference clock cycles of the reference clock signal.

2. The apparatus of claim 1, wherein the plurality of time-to-digital conversion phase samples are generated based on the output signal and the same number of reference clock cycles of the reference clock signal, and wherein the clock cycle count is generated concurrently with the time-to-digital conversion phase samples based on the same number of reference clock cycles of the reference clock signal.

3. The apparatus of claim 2, wherein the range is a Nyquist range, and wherein the Nyquist range is based on the frequency error, and wherein the frequency estimation circuitry is configured to:
generate the cycle count based frequency estimation using the clock cycle count and the number of reference clock cycles of the reference signal generator.

4. The apparatus of claim 3, wherein the cycle count based frequency estimation includes an integer frequency component and a fractional frequency component, and wherein the frequency error is based on the fractional frequency component determined for the same number of reference clock cycles of the reference clock signal.

5. The apparatus of claim 4, wherein the frequency estimation circuitry is configured to:
generate the fractional frequency estimation based on the number of reference clock cycles of the reference signal generator and the plurality of time-to-digital conversion phase samples of the output signal.

6. The apparatus of claim 5, wherein the frequency estimation circuitry is configured to:
generate the fractional frequency estimation further based on a gain of a time-to-digital converter (TDC) generating the plurality of time-to-digital conversion phase samples.

7. The apparatus of claim 5, wherein the frequency estimation circuitry is configured to:
determine the frequency error based on a difference between the fractional frequency estimation and the fractional frequency component of the cycle count based frequency estimation.

8. The apparatus of claim 7, wherein the frequency estimation circuitry is configured to:
perform a modulus operation on the frequency error to obtain the Nyquist range associated with the cycle count based frequency estimation; and
generate the frequency estimate of the output signal by adjusting the fractional frequency component of the cycle count based frequency estimation within the obtained Nyquist range with the fractional frequency estimation.

9. The apparatus of claim 1, further comprising:
a time-to-digital-converter (TDC), the TDC configured to receive the output signal and the reference clock signal, and generate the plurality of time-to-digital conversion phase samples based on the output signal and the reference clock signal.

10. The apparatus of claim 9, further comprising:
a cycle counter (CC), the CC configured to receive the output signal and the reference clock signal, and generate the clock cycle count based on the output signal and the reference clock signal.

11. A method for generating a frequency estimate of an output signal, the method comprising:
determining a clock cycle count associated with the output signal, the clock cycle count based on a reference clock signal,
generating a cycle count based frequency estimation of the output signal using the clock cycle count, the cycle count based frequency estimation including an integer frequency component and a fractional frequency component;
generating a fractional frequency estimation of the output signal based on the reference clock signal and a plurality of time-to-digital conversion phase samples of the output signal; and
generating the frequency estimate of the output signal using the cycle count based frequency estimation within a range and a frequency error determined from the fractional frequency estimation, wherein the plurality of time-to-digital conversion phase samples and the cycle count based frequency estimation use a same number of reference clock cycles of the reference clock signal.

12. The method of claim 11, further comprising:
generating the plurality of time-to-digital conversion phase samples based on the output signal and the same number of reference clock cycles of the reference clock signal.

13. The method of claim 12, wherein the range is a Nyquist range, wherein the Nyquist range is based on the frequency error, and wherein the generating of the plurality of time-to-digital conversion phase samples takes place concurrently with the determining of the clock cycle count based on the same number of reference clock cycles of the reference clock signal.

14. The method of claim 11, further comprising:
generating the fractional frequency estimation based on the same number of reference clock cycles of the reference clock signal and the plurality of time-to-digital conversion phase samples of the output signal.

15. The method of claim 11, further comprising:
determining the frequency error based on a difference between the fractional frequency estimation and the fractional frequency component of the cycle count based frequency estimation,
performing a modulus operation on the frequency error to obtain the range associated with the cycle count based frequency estimation; and
generating the frequency estimate of the output signal by adjusting the fractional frequency component of the cycle count based frequency estimation within the obtained range with the fractional frequency estimation.

16. A digital frequency synthesizer, comprising:
a reference signal generator configured to generate a reference clock signal;
a time-to-digital-converter (TDC), the TDC configured to receive an output signal and the reference clock signal, and generate a plurality of time-to-digital conversion phase samples based on the output signal and the reference clock signal;
a cycle counter (CC), the CC configured to receive the output signal and the reference clock signal, and generate a clock cycle count based on the output signal and the reference clock signal; and
a frequency estimator, the frequency estimator configured to:
generate a cycle count based frequency estimation of the output signal based on the reference clock signal and the clock cycle count;
generate a fractional frequency estimation of the output signal based on the reference clock signal and a plurality of time-to-digital conversion phase samples of the output signal; and
generate a frequency estimate of the output signal using the cycle count based frequency estimation within a range and a frequency error determined from the fractional frequency estimation, wherein the plurality of time-to-digital conversion phase samples and the cycle count based frequency estimation use a same number of reference clock cycles of the reference clock signal.

17. The digital frequency synthesizer of claim 16, wherein the range is a Nyquist range, wherein the Nyquist range is based on the frequency error, and wherein the TDC generates the plurality of time-to-digital conversion phase samples concurrently with the CC generating the clock cycle count based on the same number of reference clock cycles of the reference clock signal.

18. The digital frequency synthesizer of claim 16, wherein the frequency estimator is configured to:
generate the cycle count based frequency estimation using the clock cycle count and the same number of reference clock cycles of the reference signal generator;
wherein the cycle count based frequency estimation includes an integer frequency component and a fractional frequency component.

19. The digital frequency synthesizer of claim 18, wherein the frequency estimator is configured to:
generate the fractional frequency estimation based on the number of reference clock cycles of the reference signal generator, the plurality of time-to-digital conversion phase samples of the output signal, and a gain of the TDC.

20. The digital frequency synthesizer of claim 18, wherein the frequency estimator is configured to:
determine the frequency error based on a difference between the fractional frequency estimation and the fractional frequency component of the cycle count based frequency estimation,
perform a modulus operation on the frequency error to obtain the range associated with the cycle count based frequency estimation; and
generate the frequency estimate of the output signal by adjusting the fractional frequency component of the cycle count based frequency estimation within the obtained range with the fractional frequency estimation.

* * * * *

UNITED STATES PATENT AND TRADEMARK OFFICE
CERTIFICATE OF CORRECTION

PATENT NO. : 11,923,859 B2
APPLICATION NO. : 17/033122
DATED : March 5, 2024
INVENTOR(S) : Shumaker et al.

Page 1 of 1

It is certified that error appears in the above-identified patent and that said Letters Patent is hereby corrected as shown below:

In the Claims

In Column 25, Line 13, in Claim 11, delete "signal," and insert --signal;-- therefor Signed and Sealed this
Eighth Day of April, 2025

Coke Morgan Stewart
*Acting Director of the United States Patent and Trademark Office*